(12) United States Patent
Shen

(10) Patent No.: US 11,003,288 B2
(45) Date of Patent: May 11, 2021

(54) ACTIVE INPUT SENSING USING REGIONAL SCANNING

(71) Applicant: SYNAPTICS INCORPORATED, San Jose, CA (US)

(72) Inventor: Guozhong Shen, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 15 days.

(21) Appl. No.: 16/448,436

(22) Filed: Jun. 21, 2019

(65) Prior Publication Data

US 2020/0401249 A1 Dec. 24, 2020

(51) Int. Cl.
*G06F 3/044* (2006.01)
*G06F 3/041* (2006.01)
*H03K 17/96* (2006.01)

(52) U.S. Cl.
CPC .......... *G06F 3/044* (2013.01); *G06F 3/04166* (2019.05); *G06F 3/041661* (2019.05); *H03K 17/962* (2013.01); *H03K 2017/9615* (2013.01)

(58) Field of Classification Search
None
See application file for complete search history.

(56) References Cited

U.S. PATENT DOCUMENTS

| 8,976,145 | B2* | 3/2015 | Taylor | G06F 3/0446 345/174 |
| 9,600,137 | B2* | 3/2017 | Ross | G06F 3/0481 |
| 9,740,347 | B2 | 8/2017 | Shepelev et al. | |
| 9,977,519 | B2 | 5/2018 | Lukanc et al. | |
| 10,175,827 | B2 | 1/2019 | Shepelev et al. | |
| 2011/0193820 | A1* | 8/2011 | Chen | G06F 3/041661 345/174 |
| 2012/0050216 | A1* | 3/2012 | Kremin | G06F 3/041661 345/174 |
| 2012/0154324 | A1* | 6/2012 | Wright | G06F 3/041662 345/174 |
| 2013/0141363 | A1* | 6/2013 | Hung | G06F 3/041661 345/173 |
| 2013/0215049 | A1* | 8/2013 | Lee | G06F 3/0446 345/173 |
| 2013/0249854 | A1* | 9/2013 | Katsurahira | G06F 3/04182 345/174 |

(Continued)

*Primary Examiner* — Patrick N Edouard
*Assistant Examiner* — Peijie Shen
(74) *Attorney, Agent, or Firm* — Leydig, Voit & Mayer, Ltd.

(57) ABSTRACT

Aspects described herein include a method and associated input device and processing system. The method comprises dividing a sensing region into a plurality of regions. The sensing region is defined by a plurality of sensor electrodes. Each region of the plurality of regions is partially overlapped by one or more other regions. The method further comprises detecting, during at least a first active input sensing sub-period, a presence of an active input device by a first sensor electrode. The method further comprises selecting, based on a location of the first sensor electrode, a first region of the plurality of regions that includes the first sensor electrode. The method further comprises determining, during at least a second active input sensing sub-period, a location of the active input device using sensor electrodes that are included in the first region.

16 Claims, 12 Drawing Sheets

(56) References Cited

U.S. PATENT DOCUMENTS

| | | | |
|---|---|---|---|
| 2014/0062913 A1* | 3/2014 | Lin | G06F 3/044 345/173 |
| 2014/0062949 A1* | 3/2014 | Chang | G06F 3/0446 345/174 |
| 2014/0340359 A1* | 11/2014 | Sundara-Rajan | G06F 3/0441 345/174 |
| 2014/0375570 A1* | 12/2014 | Cok | G06F 3/041661 345/173 |
| 2014/0375590 A1* | 12/2014 | Cok | G06F 3/0446 345/174 |
| 2015/0091859 A1* | 4/2015 | Rosenberg | G06F 3/0445 345/174 |
| 2015/0261356 A1* | 9/2015 | Shepelev | G06F 3/04162 345/174 |
| 2015/0309610 A1* | 10/2015 | Rabii | G06F 3/041662 345/174 |
| 2016/0179226 A1* | 6/2016 | Shepelev | G06F 3/0442 345/174 |
| 2016/0179242 A1* | 6/2016 | Shepelev | G06F 3/0445 345/174 |
| 2016/0246390 A1* | 8/2016 | Lukanc | G06F 3/0383 |
| 2016/0252981 A1* | 9/2016 | Chang | G06F 3/03545 345/179 |
| 2016/0291679 A1* | 10/2016 | Jordan | G06F 3/041661 |
| 2016/0328056 A1* | 11/2016 | Lai | G06F 3/0443 |
| 2017/0344174 A1* | 11/2017 | Pant | G06F 3/0442 |
| 2018/0113346 A1* | 4/2018 | Han | G06K 9/0002 |
| 2019/0033965 A1* | 1/2019 | Raghunath | G06F 3/013 |
| 2019/0179475 A1* | 6/2019 | Seo | G06F 3/041661 |
| 2019/0369799 A1* | 12/2019 | Jeon | G06F 3/0445 |
| 2020/0081577 A1* | 3/2020 | Nomura | G06F 3/0441 |

\* cited by examiner

ACTIVE INPUT SENSING USING REGIONAL SCANNING

BACKGROUND

Field

Embodiments disclosed herein generally relate to electronic devices.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

One embodiment described herein is a method of sensing during one or more sensing periods, each sensing period comprising a touch sensing sub-period and at least one active input sensing sub-period. The method comprises dividing a sensing region into a plurality of regions, wherein the sensing region is defined by a plurality of sensor electrodes, and wherein each region of the plurality of regions is partially overlapped by one or more other regions of the plurality of regions. The method further comprises detecting, during at least a first active input sensing sub-period of a first sensing period, a presence of an active input device by a first sensor electrode of the plurality of sensor electrodes. The method further comprises selecting, based on a location of the first sensor electrode, a first region of the plurality of regions that includes the first sensor electrode. The method further comprises determining, during at least a second active input sensing sub-period, a location of the active input device using sensor electrodes of the plurality of sensor electrodes that are included in the first region.

Another embodiment described herein is an input device comprising a plurality of sensor electrodes defining a sensing region, and a processing system configured to divide the sensing region into a plurality of regions, wherein each region of the plurality of regions is partially overlapped by one or more other regions of the plurality of regions. The processing system is further configured to detect, during at least a first active input sensing sub-period of a first sensing period comprising a touch sensing sub-period and at least one active input sensing sub-period, a presence of an active input device by a first sensor electrode of the plurality of sensor electrodes. The processing system is further configured to select, based on a location of the first sensor electrode, a first region of the plurality of regions that includes the first sensor electrode. The processing system is further configured to determine, during at least a second active input sensing sub-period, a location of the active input device using sensor electrodes of the plurality of sensor electrodes that are included in the first region.

Another embodiment described herein is a processing system for operating a plurality of sensor electrodes defining a sensing region. The processing system comprises sensor circuitry configured to divide the sensing region into a plurality of regions, wherein each region of the plurality of regions is partially overlapped by one or more other regions of the plurality of regions. The sensor circuitry is further configured to detect, during at least a first active input sensing sub-period of a first sensing period comprising a touch sensing sub-period and at least one active input sensing sub-period, a presence of an active input device by a first sensor electrode of the plurality of sensor electrodes. The sensor circuitry is further configured to select, based on a location of the first sensor electrode, a first region of the plurality of regions that includes the first sensor electrode. The sensor circuitry is further configured to determine, during at least a second active input sensing sub-period, a location of the active input device using sensor electrodes of the plurality of sensor electrodes that are included in the first region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

Figure 1:
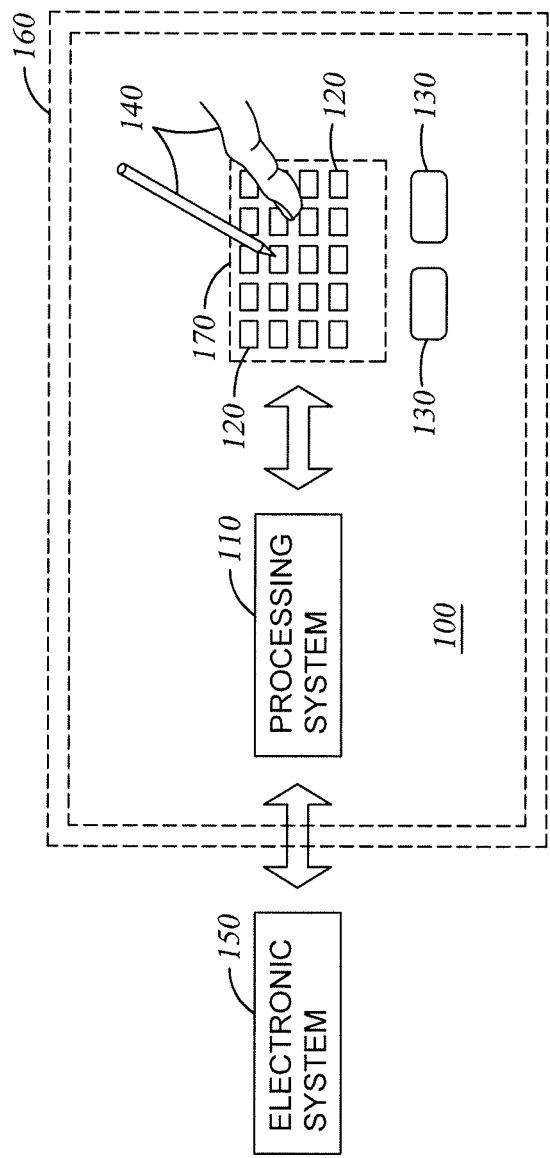
FIG. 1 is a schematic block diagram of an input device, according to one or more embodiments.

To facilitate understanding, identical reference numerals have been used, where possible, to designate identical elements that are common to the figures. It is contemplated that elements disclosed in one embodiment may be utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

Various embodiments of the present disclosure provide input devices and methods for improving usability. An input device may include electrodes that are operated as sensor electrodes to detect interaction between the input device and an input object (e.g., a stylus or a user's finger). To detect passive input objects, the input device generally drives sensing signals onto the sensor electrodes to acquire capacitive measurements and/or force measurements corresponding to a sensing region. To detect active input objects, the input device generally acquires capacitive measurements without driving sensing signals.

The location of the active input device may be determined by scanning all of the sensor electrodes of the sensing region (e.g., an active input sensing frame). However, scanning the entirety of the sensing region can be prohibitively costly in terms of hardware (e.g., receiver circuitry) and/or the amount of active input sensing time. According to one or more embodiments, the sensing region is divided into a plurality of partially overlapping regions. When a presence of the active input device is detected by a particular sensor electrode, one of the partially overlapping regions that includes the sensor electrode is selected. The location of the active input device is determined using the sensor electrodes that are included in the selected region. In this way, relatively less hardware is needed to complete active input sensing in a suitable amount of active input sensing time. In other embodiments, the active input sensing performance may be improved by performing a more focused active input sensing in the selected region.

Exemplary Input Device Implementations

FIG. 1 is a schematic block diagram of an input device 100, in accordance with embodiments of the present technology. In various embodiments, input device 100 comprises a display device integrated with a sensing device. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Example communication protocols include Inter-Integrated Circuit ($I^2C$), Serial Peripheral Interface (SPI), Personal System/2 (PS/2), Universal Serial Bus (USB), Bluetooth®, Radio Frequency (RF), and Infrared Data Association (IrDA) communication protocols.

In FIG. 1, the input device 100 is shown as a proximity sensor device (also often referred to as a "touchpad" or a "touch sensor device") configured to sense input provided by one or more input objects 140 in a sensing region 170. Example input objects include fingers and styli, as shown in FIG. 1.

Sensing region 170 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 170 extends from a surface of the input device 100 in one or more directions into space until signal-to-noise ratios prevent sufficiently accurate object detection. The distance to which this sensing region 170 extends in a particular direction, in various embodiments, may be on the order of less than a millimeter, millimeters, centimeters, or more, and may vary significantly with the type of sensing technology used and the accuracy desired. Thus, in some embodiments, sensing input may comprise no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 170 has a rectangular shape when projected onto an input surface of the input device 100.

The input device 100 may utilize any combination of sensor components and sensing technologies to detect user input in the sensing region 170. The input device 100 comprises a plurality of sensor electrodes 120 for detecting user input. The input device 100 may include one or more sensor electrodes 120 that are combined to form sensor electrodes. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensor electrodes 120 pickup loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensor electrodes 120 to create electric fields. In some capacitive implementations, separate sensor electrodes 120 may be ohmically shorted together to form larger sensor electrodes. Some capacitive implementations utilize resistive sheets, which may be uniformly resistive.

As discussed above, some capacitive implementations utilize "self-capacitance" (or "absolute capacitance") sensing methods based on changes in the capacitive coupling between sensor electrodes 120 and an input object. In one embodiment, processing system 110 is configured to drive a voltage with known amplitude onto the sensor electrode 120 and measure the amount of charge required to charge the sensor electrode to the driven voltage. In other embodiments, processing system 110 is configured to drive a known current and measure the resulting voltage. In various embodiments, an input object near the sensor electrodes 120 alters the electric field near the sensor electrodes 120, thus changing the measured capacitive coupling. In one implementation, an absolute capacitance sensing method operates by modulating sensor electrodes 120 with respect to a reference voltage (e.g. system ground) using a modulated signal, and by detecting the capacitive coupling between the sensor electrodes 120 and input objects 140.

Additionally as discussed above, some capacitive implementations utilize "mutual capacitance" (or "transcapacitance") sensing methods based on changes in the capacitive coupling between sensing electrodes. In various embodiments, an input object 140 near the sensing electrodes alters the electric field between the sensing electrodes, thus changing the measured capacitive coupling. In one implementation, a transcapacitive sensing method operates by detecting the capacitive coupling between one or more transmitter sensing electrodes (also "transmitter electrodes") and one or more receiver sensing electrodes (also "receiver electrodes") as further described below. Transmitter sensing electrodes may be electrically modulated relative to a reference voltage (e.g., system ground) to transmit a transmitter signals. Receiver sensing electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensing electrodes may be dedicated transmitter electrodes or receiver electrodes, or may be configured to both transmit and receive.

In FIG. 1, the processing system 110 is shown as part of the input device 100. The processing system 110 is configured to operate the hardware of the input device 100 to detect input in the sensing region 170. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensor electrode(s) 120 of the input device 100. In other embodiments, components of processing system 110 are physically separate with one or more components close to sensor electrode(s) 120 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a mobile device such as a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensor electrodes 120 to detect input, identification modules configured to identify gestures such as mode changing gestures, and mode changing modules for changing operation modes. Processing system 110 may also comprise one or more controllers.

In some embodiments, the processing system 110 responds to user input (or lack of user input) in the sensing region 170 directly by causing one or more actions. Example actions include changing operation modes, as well as graphical user interface (GUI) actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensor electrode(s) 120 of the input device 100 to produce electrical signals indicative of input (or lack of input) in the sensing region 170. The processing system 110 may perform any appropriate amount of processing on the electrical signals in producing the information provided to the electronic system. For example, the processing system 110 may digitize analog electrical signals obtained from the sensor electrodes 120. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 170, or some other functionality. FIG. 1 shows buttons 130 near the sensing region 170 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 170 overlaps at least part of an active area of a display screen of the display device 160. For example, the input device 100 may comprise substantially transparent sensor electrodes 120 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 160 may share physical elements. For example, some embodiments may utilize some of the same electrical components for displaying and sensing. As another example, the display device 160 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Exemplary Sensor Electrode Implementations

Figure 2:
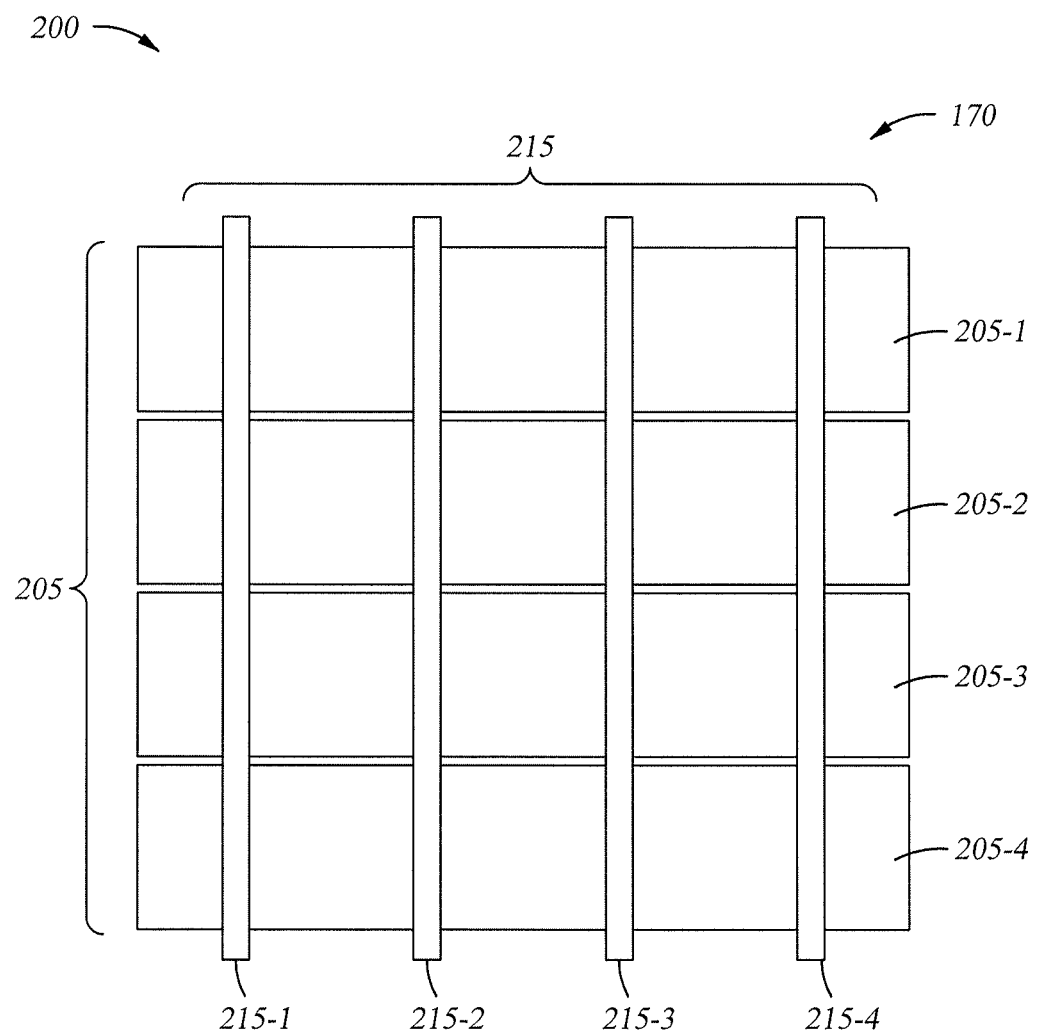
FIGS. 2 and 3 illustrate portions of exemplary sensor electrode implementations, according to one or more embodiments.
Figure 3:
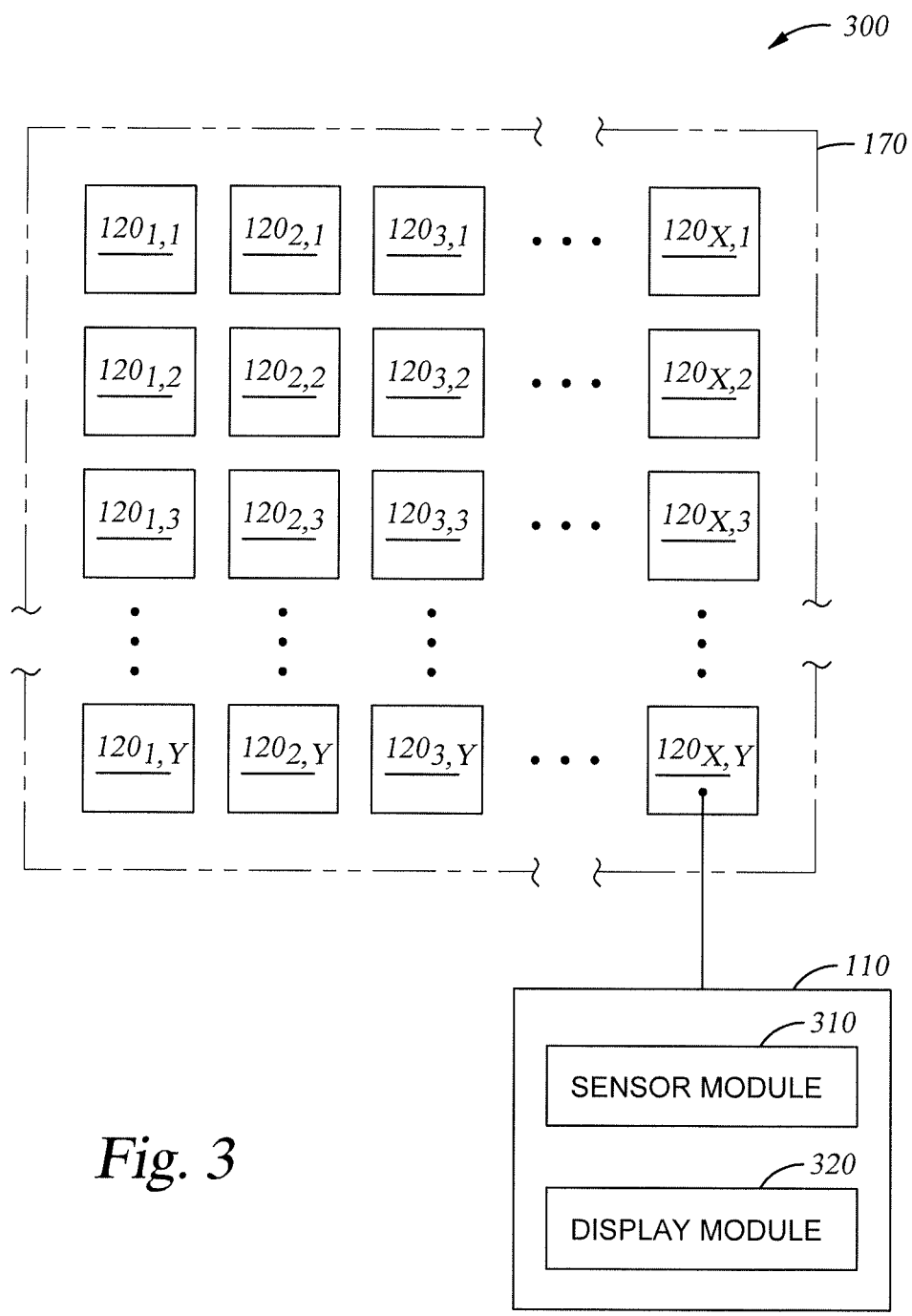

FIGS. 2 and 3 illustrate portions of exemplary sensor electrode arrangements, according to embodiments described herein. Specifically, arrangement 200 (FIG. 2) illustrates a portion of a pattern of sensor electrodes configured to sense in a sensing region 170 associated with the pattern, according to several embodiments. For clarity of illustration and description, FIG. 2 shows the sensor electrodes in a pattern of simple rectangles, and does not show various associated components. This pattern of sensing electrodes comprises a first plurality of sensor electrodes 205 (e.g., 205-1, 205-2, 205-3, 205-4), and a second plurality of sensor electrodes 215 (e.g., 215-1, 215-2, 215-3, 215-4). The sensor electrodes 205, 215 are each examples of the sensor electrodes 120 discussed above. In one embodiment, processing system 110 operates the first plurality of sensor electrodes 205 as a plurality of transmitter electrodes, and the second plurality of sensor electrodes 215 as a plurality of receiver electrodes. In another embodiment, processing system 110 operates the first plurality of sensor electrodes 205 and the second plurality of sensor electrodes 215 as absolute capacitive sensing electrodes.

The first plurality of sensor electrodes 205 and the second plurality of sensor electrodes 215 are typically ohmically isolated from each other. That is, one or more insulators separate the first plurality of sensor electrodes 205 and the second plurality of sensor electrodes 215 and prevent them from electrically shorting to each other. In some embodiments, the first plurality of sensor electrodes 205 and the second plurality of sensor electrodes 215 may be disposed on a common layer. The pluralities of sensor electrodes 205, 215 may be electrically separated by insulative material disposed between them at cross-over areas; in such constructions, the first plurality of sensor electrodes 205 and/or the second plurality of sensor electrodes 215 may be formed with jumpers connecting different portions of the same electrode. In some embodiments, the first plurality of sensor electrodes 205 and the second plurality of sensor electrodes 215 are separated by one or more layers of insulative material. In some embodiments, the first plurality of sensor electrodes 205 and the second plurality of sensor electrodes 215 are separated by one or more substrates; for example, they may be disposed on opposite sides of the same substrate, or on different substrates that are laminated together.

The pluralities of sensor electrodes 205, 215 may be formed into any desired shapes. Moreover, the size and/or shape of the sensor electrodes 205 may be different than the size and/or shape of the sensor electrodes 215. Additionally, sensor electrodes 205, 215 located on a same side of a substrate may have different shapes and/or sizes. In one embodiment, the first plurality of sensor electrodes 205 may be larger (e.g., having a larger surface area) than the second plurality of sensor electrodes 215, although this is not a requirement. In other embodiments, the first and second pluralities of sensor electrodes 205, 215 may have a similar size and/or shape.

In one embodiment, the first plurality of sensor electrodes 205 extends substantially in a first direction while the second plurality of sensor electrodes 215 extends substantially in a second direction. For example, and as shown in FIG. 2, the first plurality of sensor electrodes 205 extend in one direction, while the second plurality of sensor electrodes 215 extend in a direction substantially orthogonal to the sensor electrodes 205. Other orientations are also possible (e.g., parallel or other relative orientations).

In some embodiments, both the first and second pluralities of sensor electrodes 205, 215 are located outside of a plurality (or display stack) of layers that together form the display device 160. One example of a display stack may include layers such as a lens layer, a one or more polarizer layers, a color filter layer, one or more display electrodes layers, a display material layer, a thin-film transistor (TFT) glass layer, and a backlight layer. However, other implementations of a display stack are possible. In other embodiments, one or both of the first and second pluralities of sensor electrodes 205, 215 are located within the display stack, whether included as part of a display-related layer or a separate layer. For example, Vcom electrodes within a particular display electrode layer can be configured to perform both display updating and capacitive sensing.

Arrangement 300 of FIG. 3 illustrates a portion of a pattern of sensor electrodes configured to sense in sensing region 170, according to several embodiments. For clarity of illustration and description, FIG. 3 shows the sensor electrodes 120 in a pattern of simple rectangles and does not show other associated components. The exemplary pattern comprises an array of sensor electrodes $120_{X,Y}$ arranged in X columns and Y rows, wherein X and Y are positive integers, although one of X and Y may be zero. It is contemplated that the pattern of sensor electrodes 120 may have other configurations, such as polar arrays, repeating patterns, non-repeating patterns, a single row or column, or other suitable implementation. Further, in various embodiments the number of sensor electrodes 120 may vary from row to row and/or column to column. In one embodiment, at least one row and/or column of sensor electrodes 120 is offset from the others, such it extends further in at least one direction than the others. The sensor electrodes 120 is coupled to the processing system 110 and utilized to determine the presence (or lack thereof) of an input object in the sensing region 170.

In a first mode of operation, the arrangement of sensor electrodes 120 ($120_{1,1}$, $120_{2,1}$, $120_{3,1}$, . . . , $120_{X,Y}$) may be utilized to detect the presence of an input object via absolute sensing techniques. That is, processing system 110 is configured to modulate sensor electrodes 120 to acquire measurements of changes in capacitive coupling between the modulated sensor electrodes 120 and an input object to determine the position of the input object. Processing system 110 is further configured to determine changes of absolute capacitance based on a measurement of resulting signals received with sensor electrodes 120 which are modulated.

In some embodiments, the arrangement 300 includes one or more grid electrodes (not shown) that are disposed between at least two of the sensor electrodes 120. The grid electrode(s) may at least partially circumscribe the plurality of sensor electrodes 120 as a group, and may also, or in the alternative, completely or partially circumscribe one or more of the sensor electrodes 120. In one embodiment, the grid electrode is a planar body having a plurality of apertures, where each aperture circumscribes a respective one of the sensor electrodes 120. In other embodiments, the grid electrode(s) comprise a plurality of segments that may be driven individually or in groups or two or more segments. The grid electrode(s) may be fabricated similar to the sensor electrodes 120. The grid electrode(s), along with sensor electrodes 120, may be coupled to the processing system 110 utilizing conductive routing traces and used for input object detection.

The sensor electrodes 120 are typically ohmically isolated from each other, and are also ohmically isolated from the grid electrode(s). That is, one or more insulators separate the sensor electrodes 120 and grid electrode(s) and prevent them from electrically shorting to each other. In some embodiments, the sensor electrodes 120 and grid electrode(s) are separated by an insulative gap, which may be filled with an electrically insulating material, or may be an air gap. In some embodiments, the sensor electrodes 120 and the grid electrode(s) are vertically separated by one or more layers of insulative material. In some other embodiments, the sensor electrodes 120 and the grid electrode(s) are separated by one or more substrates; for example, they may be disposed on opposite sides of the same substrate, or on different substrates. In yet other embodiments, the grid electrode(s) may be composed of multiple layers on the same substrate, or on different substrates. In one embodiment, a first grid electrode may be formed on a first substrate (or a first side of a substrate) and a second grid electrode may be formed on a second substrate (or a second side of a substrate). For example, a first grid electrode comprises one or more common electrodes disposed on a thin-film transistor (TFT) layer of the display device 160 (FIG. 1) and a second grid electrode is disposed on the color filter glass of the display device 160. The dimensions of the first and second grid electrodes can be equal or differ in at least one dimension.

In a second mode of operation, the sensor electrodes 120 ($120_{1,1}$, $120_{2,1}$, $120_{3,1}$, . . . , $120_{X,Y}$) may be utilized to detect the presence of an input object via transcapacitive sensing techniques when a transmitter signal is driven onto the grid electrode(s). That is, processing system 110 is configured to drive the grid electrode(s) with a transmitter signal and to receive resulting signals with each sensor electrode 120, where a resulting signal comprising effects corresponding to the transmitter signal, which is utilized by the processing system 110 or other processor to determine the position of the input object.

In a third mode of operation, the sensor electrodes 120 may be split into groups of transmitter and receiver electrodes utilized to detect the presence of an input object via transcapacitive sensing techniques. That is, processing system 110 may drive a first group of sensor electrodes 120 with a transmitter signal and receive resulting signals with the second group of sensor electrodes 120, where a resulting signal comprising effects corresponding to the transmitter signal. The resulting signal is utilized by the processing system 110 or other processor to determine the position of the input object.

The input device 100 may be configured to operate in any one of the modes described above. The input device 100 may also be configured to switch between any two or more of the modes described above.

The areas of localized capacitive sensing of capacitive couplings may be termed "capacitive pixels," "touch pixels," "tixels," etc. Capacitive pixels may be formed between an individual sensor electrode 120 and a reference voltage in the first mode of operation, between the sensor electrodes 120 and grid electrode(s) in the second mode of operation, and between groups of sensor electrodes 120 used as transmitter and receiver electrodes (e.g., arrangement 200 of FIG. 2). The capacitive coupling changes with the proximity and motion of input objects in the sensing region 170 associated with the sensor electrodes 120, and thus may be used as an indicator of the presence of the input object in the sensing region of the input device 100.

In some embodiments, the sensor electrodes 120 are "scanned" to determine these capacitive couplings. That is, in one embodiment, one or more of the sensor electrodes 120 are driven to transmit transmitter signals. Transmitters may be operated such that one transmitter electrode transmits at one time, or such that multiple transmitter electrodes transmit at the same time. Where multiple transmitter electrodes transmit simultaneously, the multiple transmitter electrodes may transmit the same transmitter signal and thereby produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined. In one embodiment, multiple transmitter electrodes may simultaneously transmit the same transmitter signal while the receiver electrodes receive the effects and are measured according to a scanning scheme.

The sensor electrodes 120 configured as receiver sensor electrodes may be operated singly or multiply to acquire resulting signals. The resulting signals may be used to determine measurements of the capacitive couplings at the capacitive pixels. Processing system 110 may be configured to receive with the sensor electrodes 120 in a scanning fashion and/or a multiplexed fashion to reduce the number of simultaneous measurements to be made, as well as the size of the supporting electrical structures. In one embodiment, one or more sensor electrodes are coupled to a receiver of processing system 110 via a switching element such as a multiplexer or the like. In such an embodiment, the switching element may be internal to processing system 110 or external to processing system 110. In one or more embodiments, the switching elements may be further configured to couple a sensor electrode 120 with a transmitter or other signal and/or voltage potential. In one embodiment, the switching element may be configured to couple more than one receiver electrode to a common receiver at the same time.

In other embodiments, "scanning" sensor electrodes 120 to determine these capacitive couplings comprises modulating one or more of the sensor electrodes and measuring an absolute capacitance of the one or more sensor electrodes. In another embodiment, the sensor electrodes may be operated such that more than one sensor electrode is driven and received with at a time. In such embodiments, an absolute capacitive measurement may be obtained from each of the one or more sensor electrodes 120 simultaneously. In one embodiment, each of the sensor electrodes 120 are simultaneously driven and received with, obtaining an absolute capacitive measurement simultaneously from each of the sensor electrodes 120. In various embodiments, processing system 110 may be configured to selectively modulate a portion of sensor electrodes 120. For example, the sensor electrodes may be selected based on, but not limited to, an application running on the host processor, a status of the input device, and an operating mode of the sensing device. In various embodiments, processing system 110 may be configured to selectively shield at least a portion of sensor electrodes 120 and to selectively shield or transmit with the grid electrode(s) 122 while selectively receiving and/or transmitting with other sensor electrodes 120.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In any of the above embodiments, multiple sensor electrodes 120 may be ganged together such that the sensor electrodes 120 are simultaneously modulated or simultaneously received with. As compared to the methods described above, ganging together multiple sensor electrodes may produce a coarse capacitive image that may not be usable to discern precise positional information. However, a coarse capacitive image may be used to sense presence of an input object. In one embodiment, the coarse capacitive image may be used to move processing system 110 or the input device 100 out of a "doze" mode or low-power mode. In one embodiment, the coarse capacitive image may be used to move a capacitive sensing IC out of a "doze" mode or low-power mode. In another embodiment, the coarse capacitive image may be used to move at least one of a host IC and a display driver out of a "doze" mode or low-power mode. The coarse capacitive image may correspond to the entire sensor area or only to a portion of the sensor area.

The background capacitance of the input device 100 is the capacitive image associated with no input object in the sensing region 170. The background capacitance changes with the environment and operating conditions, and may be estimated in various ways. For example, some embodiments take "baseline images" when no input object is determined to be in the sensing region 170, and use those baseline images as estimates of their background capacitances. The background capacitance or the baseline capacitance may be present due to stray capacitive coupling between two sensor electrodes, where one sensor electrode is driven with a modulated signal and the other is held stationary relative to system ground, or due to stray capacitive coupling between a receiver electrode and nearby modulated electrodes. In many embodiments, the background or baseline capacitance may be relatively stationary over the time period of a user input gesture.

Capacitive images can be adjusted for the background capacitance of the input device 100 for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, one or more of the sensor electrodes 120 comprise one or more display electrodes used in updating the display of the display screen. The display electrodes may comprise one or more elements of the active matrix display such as one or more segments of a segmented Vcom electrode (common electrode(s)), a source drive line, gate line, an anode sub-pixel electrode or cathode pixel electrode, or any other suitable display element. These display electrodes may be disposed on an appropriate display screen substrate. For example, the common electrodes may be disposed on a transparent substrate (a glass substrate, TFT glass, or any other transparent material) in some display screens (e.g., In-Plane Switching (IPS), Fringe Field Switching (FFS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, the display electrode can also be referred to as a "combination electrode," since it performs multiple functions. In various embodiments, each of the sensor electrodes 120 comprises one or more common electrodes. In other embodiments, at least two sensor electrodes 120 may share at least one common electrode. While the following description may describe that sensor electrodes 120 and/or grid electrode(s) comprise one or more common electrodes, various other display electrodes as describe above may also be used in conjunction with the common electrode or as an alternative to the common electrodes. In various embodiments, the sensor electrodes 120 and grid electrode(s) comprise the entire common electrode layer (Vcom electrode).

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer multiple of the display frame rate. In one or more embodiments, the display frame rate may change (e.g., to reduce power or to provide additional image data such as a 3D display information) while touch frame rate maintains constant. In other embodiment, the display frame rate may remain constant while the touch frame rate is increased or decreased.

Continuing to refer to FIG. 3, the processing system 110 coupled to the sensor electrodes 120 includes a sensor module 310 and optionally, a display module 320. The sensor module 310 includes circuitry configured to drive at least one of the sensor electrodes 120 for capacitive sensing during periods in which input sensing is desired. In one embodiment, the sensor module 310 is configured to drive a modulated signal onto the at least one sensor electrode 120 to detect changes in absolute capacitance between the at least one sensor electrode and an input object. In another embodiment, the sensor module 310 is configured to drive a transmitter signal onto the at least one sensor electrode 120 to detect changes in a transcapacitance between the at least one sensor electrode and another sensor electrode 120. The modulated and transmitter signals are generally varying voltage signals comprising a plurality of voltage transitions over a period of time allocated for input sensing. In various embodiments, the sensor electrodes 120 and/or grid electrode(s) may be driven differently in different modes of operation. In one embodiment, the sensor electrodes 120 and/or grid electrode(s) may be driven with signals (modulated signals, transmitter signals and/or shield signals) that may differ in any one of phase, amplitude, and/or shape. In various embodiments, the modulated signal and transmitter signal are similar in at least one shape, frequency, amplitude, and/or phase. In other embodiments, the modulated signal and the transmitter signals are different in frequency, shape, phase, amplitude, and phase. The sensor module 310 may be selectively coupled one or more of the sensor electrodes 120 and/or the grid electrode(s). For example, the sensor module 310 may be coupled to selected portions of the sensor electrodes 120 and operate in either an absolute or transcapacitive sensing mode. In another example, the sensor module 310 may be a different portion of the sensor electrodes 120 and operate in either an absolute or transcapacitive sensing mode. In yet another example, the sensor module 310 may be coupled to all the sensor electrodes 120 and operate in either an absolute or transcapacitive sensing mode.

The sensor module 310 is configured to operate the grid electrode(s) as a shield electrode that may shield sensor electrodes 120 from the electrical effects of nearby conductors. In one embodiment, the processing system is configured to operate the grid electrode(s) as a shield electrode that may "shield" sensor electrodes 120 from the electrical effects of nearby conductors, and to guard the sensor electrodes 120 from grid electrode(s), at least partially reducing the parasitic capacitance between the grid electrode(s) and the sensor electrodes 120. In one embodiment, a shielding signal is driven onto the grid electrode(s). The shielding signal may be a ground signal, such as the system ground or other ground, or any other constant voltage (i.e., non-modulated) signal. In another embodiment, operating the grid electrode(s) as a shield electrode may comprise electrically floating the grid electrode. In one embodiment, grid electrode(s) are able to operate as an effective shield electrode while being electrode floated due to its large coupling to the other sensor electrodes. In other embodiment, the shielding signal may be referred to as a "guarding signal" where the guarding signal is a varying voltage signal having at least one of a similar phase, frequency, and amplitude as the modulated signal driven on to the sensor electrodes. In one or more embodiment, routing traces may be shielded from responding to an input object due to routing beneath the grid electrode(s) and/or sensor electrodes 120, and therefore may not be part of the active sensor electrodes, shown as sensor electrodes 120.

In one or more embodiments, capacitive sensing (or input sensing) and display updating may occur during at least partially overlapping periods. For example, as a common electrode is driven for display updating, the common electrode may also be driven for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiments, the non-display update period may be referred to as a "long horizontal blanking period," "long h-blanking period" or a "distributed blanking period," where the blanking period occurs between two display updating periods and is at least as long as a display update period. In one embodiment, the non-display update period occurs between display line update periods of a frame and is long enough to allow for multiple transitions of the transmitter signal to be driven onto the sensor electrodes 120. In other embodiments, the non-display update period may comprise horizontal blanking periods and vertical blanking periods. Processing system 110 may be configured to drive sensor electrodes 120 for capacitive sensing during any one or more of or any combination of the different non-display update times. Synchronization signals may be shared between sensor module 310 and display module 320 to provide accurate control of overlapping display updating and capacitive sensing periods with repeatably coherent frequencies and phases. In one embodiment, these synchronization signals may be configured to allow the relatively stable voltages at the beginning and end of the input sensing period to coincide with display update periods with relatively stable voltages (e.g., near the end of a input integrator reset time and near the end of a display charge share time). A modulation frequency of a modulated or transmitter signal may be at a harmonic of the display line update rate, where the phase is determined to provide a nearly constant charge coupling from the display elements to the receiver electrode, allowing this coupling to be part of the baseline image.

The sensor module 310 includes circuitry configured to receive resulting signals with the sensor electrodes 120 and/or grid electrode(s) comprising effects corresponding to the modulated signals or the transmitter signals during periods in which input sensing is desired. The sensor module 310 may determine a position of the input object in the sensing region 170 or may provide a signal including information indicative of the resulting signal to another module or processor, for example, a determination module or a processor of an associated electronic system 150 (i.e., a host processor), for determining the position of the input object in the sensing region 170.

The display module 320 may be included in or separate from the processing system 110. The display module 320 includes circuitry configured to provide display image update information to the display of the display device 160 during non-sensing (e.g., display updating) periods.

In one embodiment, the processing system 110 comprises a first integrated controller comprising the display module 320 and at least a portion of the sensor module 310 (i.e., transmitter module and/or receiver module). In another embodiment, the processing system 110 comprises a first integrated controller comprising the display module 320 and a second integrated controller comprising the sensor module 310. In yet another embodiment, the processing system comprises a first integrated controller comprising display module 320 and a first portion of the sensor module 310 (e.g., one of a transmitter module and a receiver module) and a second integrated controller comprising a second portion of the sensor module 310 (e.g., the other one of the transmitter and receiver modules). In those embodiments comprising multiple integrated circuits, a synchronization mechanism may be coupled between them, configured to synchronize display updating periods, sensing periods, transmitter signals, display update signals, and the like.

Exemplary Arrangements for Active Input Sensing Using Regional Scanning

Figure 4:
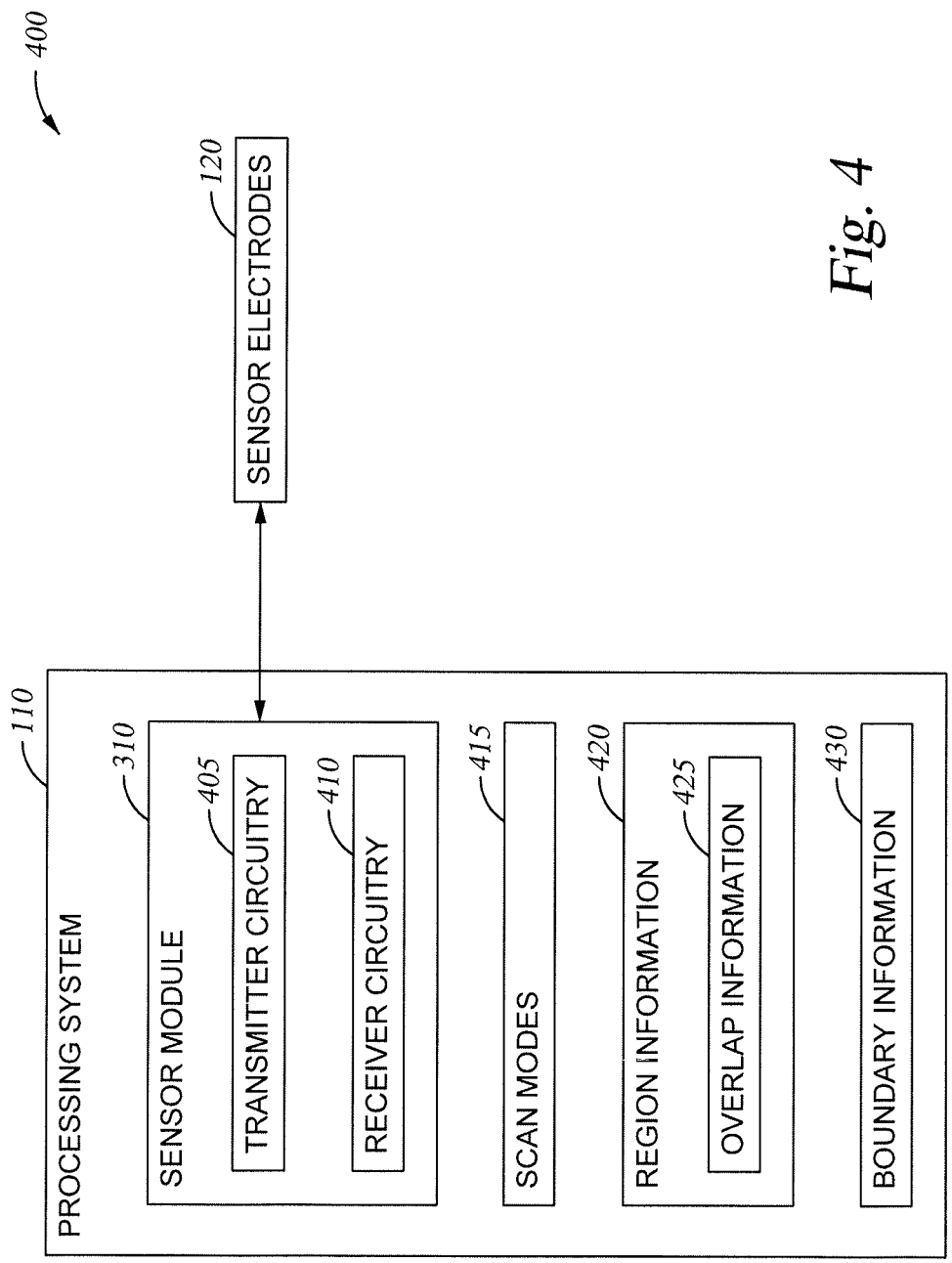
FIG. 4 is a diagram illustrating an exemplary processing system, according to one or more embodiments.

FIG. 4 is a diagram 400 illustrating an exemplary processing system 110, according to one or more embodiments. The features illustrated in diagram 400 may be used in conjunction with other embodiments. The sensor module 310 of the processing system 110 is coupled with the plurality of sensor electrodes 120. The sensor module 310 comprises transmitter circuitry 405 and receiver circuitry 410. Although the transmitter circuitry 405 and the receiver circuitry 410 are depicted as separate components, in other embodiments the transmitter circuitry 405 and the receiver circuitry 410 may have shared circuitry.

In some embodiments, the transmitter circuitry 405 comprises one or more sensor electrode transmitters that are configured to drive sensing signals (e.g., modulated signals) onto the plurality of sensor electrodes 120 for performing capacitive sensing, force sensing, etc. In some embodiments, the transmitter circuitry 405 comprises one or more guard amplifiers that are configured to drive guarding signals onto the plurality of sensor electrodes 120. In some embodiments, the transmitter circuitry 405 comprises one or more coarse background compensation (CBC) transmitters that are configured to mitigate a background capacitance of the plurality of sensor electrodes 120. Any suitable combination of components of the transmitter circuitry 405 is contemplated. Further, any other components that are configured to drive signals onto the plurality of sensor electrodes 120 to provide functionality to the sensor module 310 may be included in the transmitter circuitry 405.

In some embodiments, the receiver circuitry 410 comprises a plurality of analog front-ends (AFEs) that are each configured to acquire capacitive measurements, force measurements, etc. using the plurality of sensor electrodes 120. The receiver circuitry 410 is configured to acquire capacitive measurements (e.g., absolute capacitive measurements and/or transcapacitive measurements) using the plurality of sensor electrodes 120 when performing touch sensing and when performing active input sensing. In some embodiments, each AFE comprises an analog-to-digital converter (ADC) of any suitable type, such as a pipelined ADC, a successive approximation ADC, an integrating ADC, a sigma-delta ADC, and so forth. Each AFE may comprise other suitable circuitry for acquiring the various capacitive measurements, such as filtering circuitry or other signal conditioning circuitry (e.g., an amplifier). In some embodiments, each AFE includes a CBC capacitor that is used to mitigate a background capacitance of the plurality of sensor electrodes 120.

When acquiring capacitive measurements, the sensor module 310 may operate the plurality of sensor electrodes 120 according to a selected scan mode of a plurality of scan modes 415. In some embodiments, the sensor module 310 may control a plurality of switches according to the selected scan mode, which couples selected ones of the plurality of sensor electrodes 120 with the transmitter circuitry 405 and/or the receiver circuitry 410. In some embodiments, one or more of the plurality of scan modes 415 may configure the sensor module 310 to sequentially acquire capacitive measurements for touch frames and/or active frames corresponding to an entirety of the sensing region defined by the plurality of sensor electrodes 120.

In some embodiments, different scan modes of the plurality of scan modes 415 correspond to different power consumption levels of the sensor module 310. For example, to reduce power consumption, one or more scan modes of the plurality of scan modes 415 may sense with a reduced resolution, e.g., by sensing using fewer than all of the plurality of sensor electrodes 120. Some examples of sensing with a reduced resolution include sensing along only one dimension (e.g., sensing using either rows or columns of the sensor electrodes 120), sensing using every other sensor electrode 120, and so forth. In some embodiments, the sensor module 310 is configured to sense with a reduced resolution while detecting a presence of an active input device (e.g., from a state in which the active input device is not detected).

The processing system 110 comprises region information 420 that may be used by the sensor module 310 to divide the sensing region (defined by the plurality of sensor electrodes 120) into a plurality of regions. Each of the plurality of regions includes one or more of the sensor electrodes 120. Each sensor electrode 120 of a set is assigned to at least one region of the plurality of regions. In some embodiments, the set comprises less than all of the plurality of sensor electrodes 120. In other embodiments, the set comprises all of the plurality of sensor electrodes 120.

The region information 420 may be implemented in any suitable form. Further, the region information 420 may be predefined or dynamically determined. The plurality of regions may have any suitable sizing. In some embodiments, the plurality of regions are sized such that each region includes a number of sensor electrodes that is less than or equal to a number of receive channels of the sensor module 310. In this way, the receiver circuitry 410 may acquire measurements for each of the sensor electrodes of a region contemporaneously, which can reduce an amount of time used for performing active input sensing. In some cases, each region of the plurality of regions is a same size. In other cases, at least one region of the plurality of regions is a different size.

In some embodiments, the plurality of regions specified by the region information 420 divide the sensing region along one dimension. For example, the plurality of regions may be defined relative to either rows or columns of the sensor electrodes 120. In other embodiments, the plurality of regions divides the sensing region along two dimensions. For example, the plurality of regions may be defined relative to both rows and columns of the sensor electrodes 120.

In some embodiments, each region specified by the region information 420 is partially overlapped by one or more other regions. The processing system 110 comprises overlap information 425 reflecting one or more overlap regions in which two or more regions of the plurality of regions overlap. The processing system 110 further comprises boundary information 430 reflecting one or more boundaries within the one or more overlap regions. The boundary information 430 may be used to determine which region of the plurality of regions to scan for active input sensing. For example, the presence of an active input device may be detected at a sensor electrode 120 included in an overlap region of a first region and a second region. Based on the location of the sensor electrode 120 within the overlap region (e.g., the location relative to the boundary), either the first region or the second region may be selected to scan when determining the location of the active input device.

In some embodiments, the processing system 110 performs active input sensing according to the region information 420. By performing active input sensing according to the region information 420, an amount of time used for performing active input sensing may be reduced, permitting additional time budget within a given period to perform touch sensing and/or display updating. In other embodiments, assuming the amount of time budgeted for active input sensing remains constant, the active input sensing performance may be improved by performing a more focused active input sensing in the selected regions.

Figure 5:
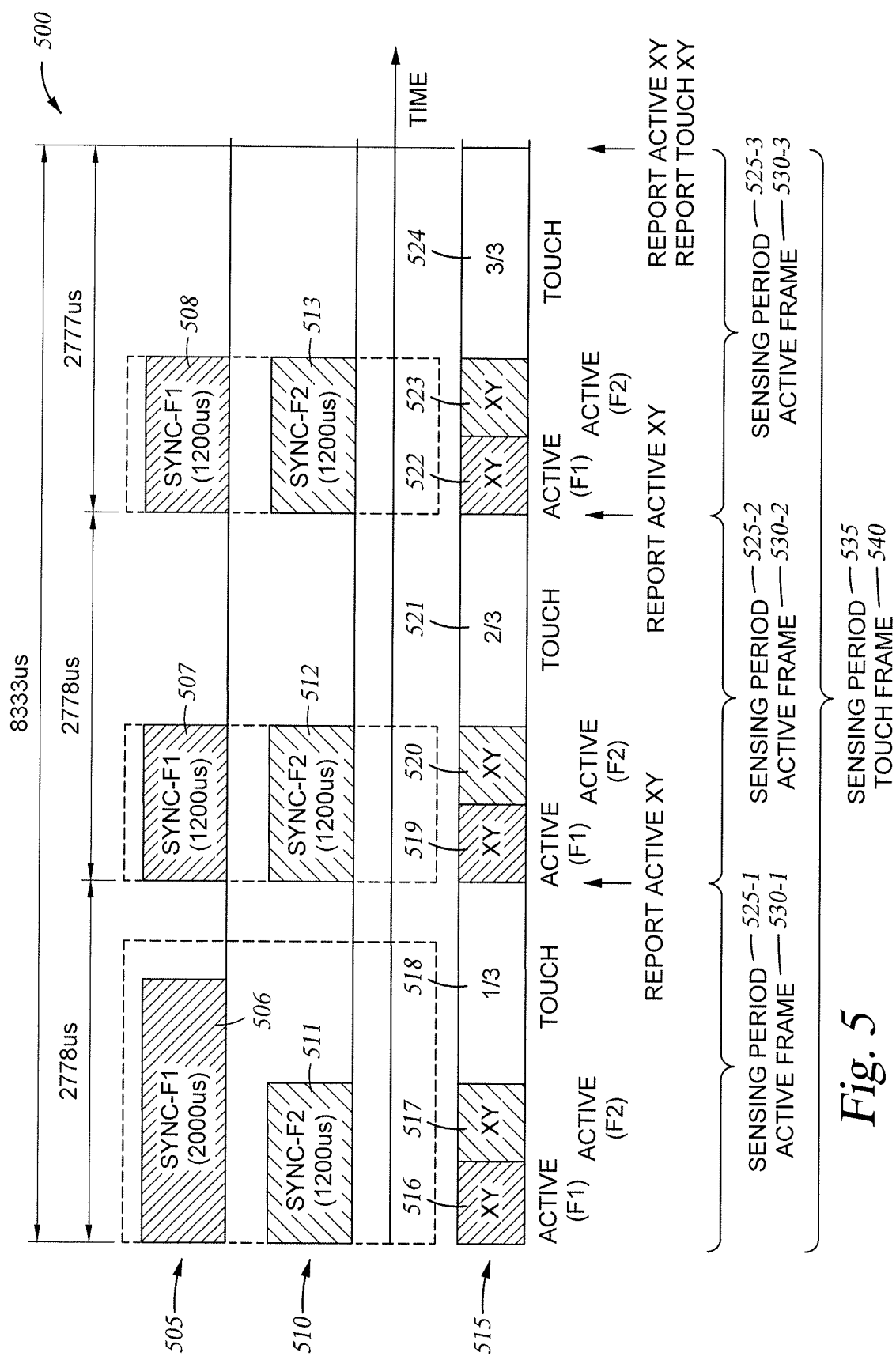
FIG. 5 is an exemplary timing diagram for sensing an active input device configured to transmit multiple frequencies, according to one or more embodiments.

FIG. 5 is an exemplary timing diagram 500 for sensing an active input device configured to transmit multiple frequencies, according to one or more embodiments. The features illustrated in the timing diagram 500 may be used in conjunction with other embodiments, e.g., to control a timing of active input sensing and touch sensing of the sensor module 310 depicted in FIG. 4.

As shown, the active input device is configured to periodically transmit two signals at two different frequencies. Plot 505 illustrates transmit periods 506, 507, 508, during which a first signal is transmitted by the active input device at a first frequency F1. Plot 510 illustrates transmit periods 511, 512, 513, during which a second signal is transmitted by the active input device at a second frequency F2. Any suitable values of the first frequency F1 and the second frequency F2 are contemplated, and in some cases may vary based on the frequency response of the sensor electrodes 120. In some embodiments, the first frequency F1 and the second frequency F2 are each within a range from 50 kilohertz (kHz) to 500 kHz. The active input device may transmit the first signal and the second signal from different locations. In one embodiment, the active input device transmits the first signal from a conductive tip of the active input device, and transmits the second signal from a conductive ring spaced apart from the conductive tip (e.g., 1-20 millimeters away). Other implementations of the active input device supporting transmission at multiple frequencies are also contemplated.

The different signals and different frequencies F1, F2 may enable additional functionality of the processing system 110 (depicted in FIG. 4). For example, the first signal may be used for determining a location of the active input device relative to a sensing region, and the second signal may be used for determining a tilt of the active input device relative to the sensing region. Using the example implementation described above, the first signal received from the conductive tip may be used to determine the location of the conductive tip, which may also be determined as the location of the active input device. The location of the conductive ring may be determined using the second signal. By comparing the location of the conductive tip and the location of the conductive ring, and having a predefined distance between the conductive tip and the conductive ring, a tilt of the active input device may be determined.

In the example illustrated in the timing diagram 500, the transmit periods 506, 507, 508 and the transmit periods 511, 512, 513 are transmitted with a predefined periodicity (as shown, about 2.778 milliseconds). The transmit period 506 has a duration of 2.000 ms, and the transmit periods 507, 508, 511, 512, 513 each have a duration of 1.200 ms. The transmit periods 506, 511 are partly overlapping, the transmit periods 507, 512 are entirely overlapping, and the transmit periods 508, 513 are entirely overlapping. Thus, the active input device may be configured to simultaneously transmit at the frequencies F1, F2 during each of the transmit periods 506, 511, the transmit periods 507, 512, and the transmit periods 508, 513.

Plot 515 illustrates a timing of the processing system to accommodate active input sensing and touch sensing. The plot 515 includes active input sensing sub-periods 516, 517 and a touch sensing sub-period 518 in a first sensing period 525-1, active input sensing sub-periods 519, 520 and a touch sensing sub-period 521 in a second sensing period 525-2, and active input sensing sub-periods 522, 523 and a touch sensing sub-period 524 in a third sensing period 525-3.

During the active input sensing sub-periods 516, 519, 522, which respectively overlap with the transmit periods 506, 511, with the transmit periods 507, 512, and with the transmit periods 508, 513, measurements may be acquired of the first signal at the first frequency F1 to determine the location of the active input device in the sensing region in two dimensions (X and Y). During the active input sensing sub-periods 517, 520, 523, which respectively overlap with the transmit periods 506, 511, with the transmit periods 507, 512, and with the transmit periods 508, 513, measurements may be acquired of the second signal at the second frequency F2 to determine the location of the active input device in the sensing region in two dimensions (X and Y).

In some embodiments, the measurements acquired during each of the active input sensing sub-periods 516, 517, 519, 520, 522, 523 may represent an active frame corresponding to an entirety of the sensing region. The measurements acquired during each of the touch sensing sub-periods 518, 521, 524 may represent a portion of a touch frame corresponding to the entirety of the sensing region. In some embodiments, the touch frame 540 comprises a plurality of distributed touch sensing sub-periods 518, 521, 524. In some embodiments, the touch frame 540 further comprises a plurality of active input sensing sub-periods 516, 517, 519, 520, 522, 523.

Thus, in the timing diagram 500, the sensor module 310 may acquire active input measurements at a rate of 360 frames per second (fps), as three (3) active frames 530-1, 530-2, 530-3 are acquired within a sensing period 535 of 8.333 ms. The sensor module 310 may acquire touch measurements at a rate of 120 fps, as one touch frame 540 is acquired within the sensing period 535. It will be understood that the various values shown in the timing diagram 500 are merely examples, and that the timing may vary based on the particular implementation of the input device (e.g., the characteristics of the sensing region 170 and/or the sensor module 310). For example, each sensing period 525-1, 525-2, 525-3 may be longer or shorter, the touch sensing sub-periods 518, 521, 524 may be longer within the respective sensing periods 525-1, 525-2, 525-3 to improve touch sensing performance, the active input sensing sub-periods 516, 517, 519, 520, 522, 523 may be longer within the respective sensing periods 525-1, 525-2, 525-3 to improve active input sensing performance, the touch sensing sub-periods 518, 521, 524 and the active input sensing sub-periods 516, 517, 519, 520, 522, 523 may have a different ordering within the respective sensing periods 525-1, 525-2, 525-3, and so forth.

According to some embodiments, active input sensing may be performed within selected region(s) (e.g., according to region information 420 of FIG. 4). For example, the sensor module 310 may acquire active input measurements for a selected region during each active input sensing sub-periods 516, 517, 519, 520, 522, 523 instead of acquiring an entire active frame. In some cases, the active input measurements for the selected region may be measurements in two dimensions (X and Y). The amount of time used for performing active input sensing (e.g., active input sensing sub-periods 516, 517, 519, 520, 522, 523) may be reduced, permitting additional time budget within a given period to perform touch sensing (e.g., touch sensing sub-periods 518, 521, 524) and/or display updating. In other embodiments, assuming the amount of time budgeted for active input sensing remains constant, the active input sensing performance may be improved by performing a more focused active input sensing in the selected region(s).

Figure 6:
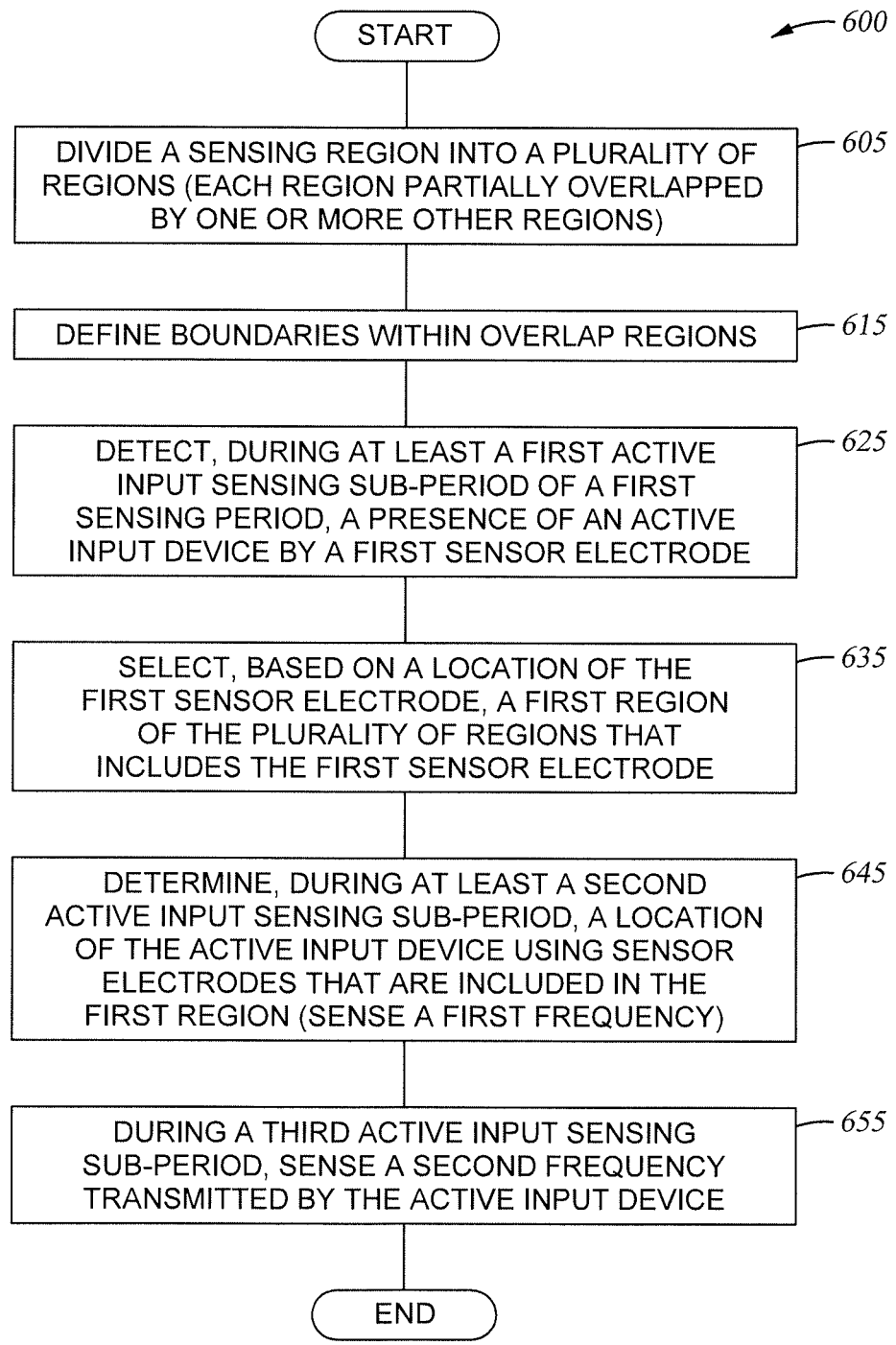
FIG. 6 is a method of sensing using partially overlapping regions of a sensing region, according to one or more embodiments.

FIG. 6 is a method 600 of sensing using partially overlapping regions of a sensing region, according to one or more embodiments. The method 600 may be used in conjunction with other embodiments, e.g., performed using the sensor module 310 depicted in FIG. 4.

The method 600 begins at block 605, where a sensing area may be divided into a plurality of regions. The sensing area may be defined by a plurality of sensor electrodes. Each region of the plurality of regions may be partially overlapped by one or more other regions of the plurality of regions.

At block 615, one or more boundaries may be defined within one or more overlap regions. In each of the one or more overlap regions, a respective first region of the plurality of regions may overlap a respective second region of the plurality of regions. In some embodiments, the one or more boundaries may be defined within the one or more overlap regions along one dimension. In one example, the boundary may be defined halfway along the dimension in the first overlap region.

At block 625, during at least a first active input sensing sub-period of a first sensing period, the presence of an active input device may be detected by a first sensor electrode. In some embodiments, the first sensing period further comprises at least one touch sensing period. In some cases, the active input device may be detected by a plurality of adjacent sensor electrodes, and the first sensor electrode may be determined as the sensor electrode that is closest to the active input device. The closest sensor electrode may be determined using any suitable techniques, such as the sensor electrode having the greatest measured signal strength (e.g., decibel-milliwatts (dBm), Received Signal Strength Indicator (RSSI), signal-to-noise ratio (SNR), and so forth).

At block 635, a first region may be selected that includes the first sensor electrode. In some embodiments, the first region may be selected based on a position of the first sensor electrode within a first overlap region, where the first region overlaps a second region of the plurality of regions. In some embodiments, selecting the first region may comprise determining which side of the boundary the first sensor electrode is located.

At block 645, during at least a second active input sensing sub-period, a location of the active input device may be determined using sensor electrodes that are included in the first region. In some embodiments, determining the location of the active input device may comprise sensing at a first frequency. In some embodiments, the second active input sensing sub-period may be included in the first sensing period. In other embodiments, the second active input sensing sub-period may be included in a second sensing period. At block 655, during a third active input sensing sub-period, a second frequency that is transmitted by the active input device may be sensed. In some embodiments, the third active input sensing sub-period may be included in the first sensing period. In other embodiments, the third active input sensing sub-period is included in a second sensing period. The method 600 ends following completion of block 655.

Figure 7:
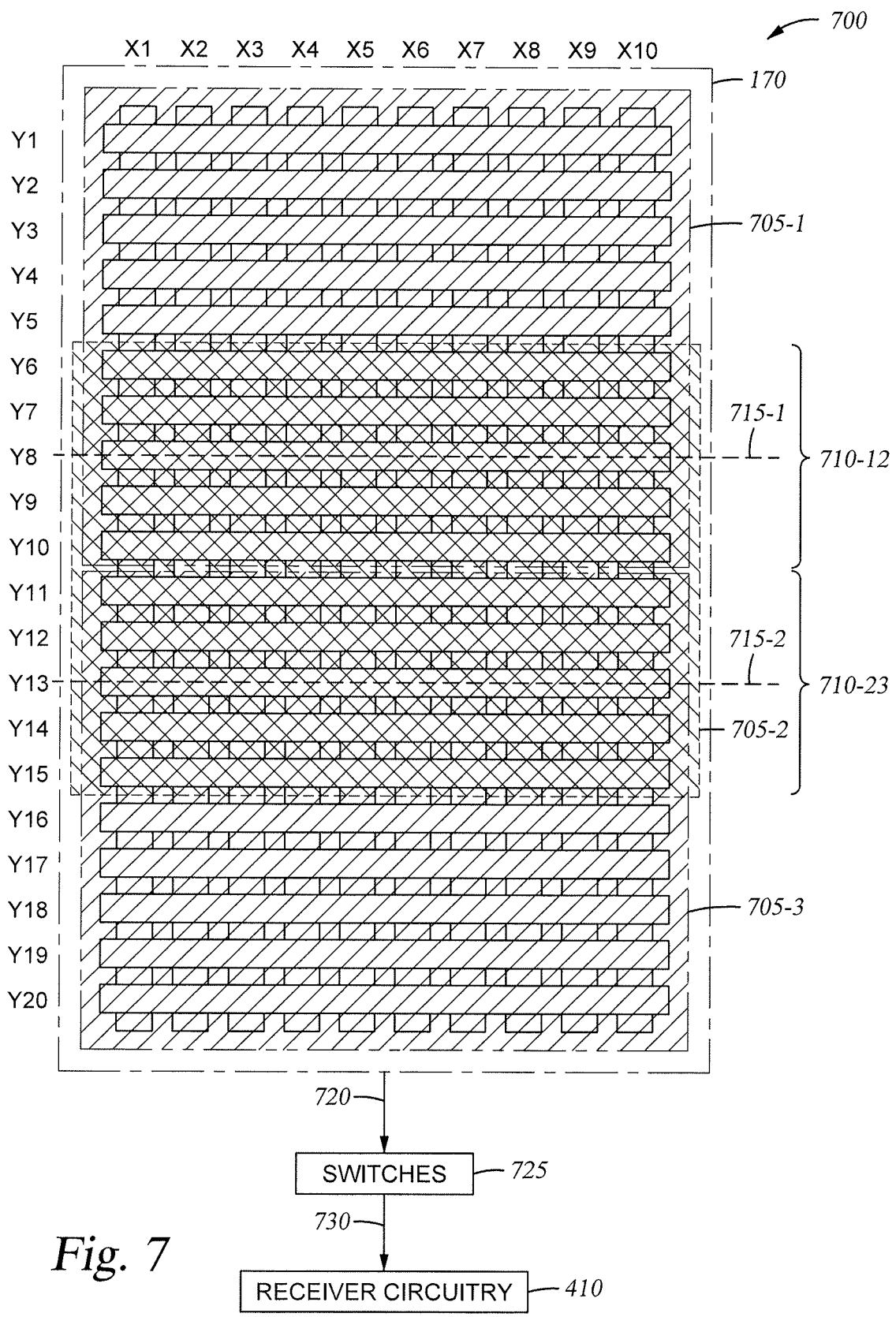
FIG. 7 is a diagram illustrating a sensing region divided into partially overlapping regions along one dimension, according to one or more embodiments.

FIG. 7 is a diagram 700 illustrating a sensing region 170 divided into partially overlapping regions along one dimension, according to one or more embodiments. The features illustrated in the diagram 700 may be used in conjunction with other embodiments, e.g., reflecting performance of a portion of the method 600 by the sensor module 310.

The sensing region 170 may be defined by a plurality of sensor electrodes X1, X2, ..., X10 and a plurality of sensor electrodes Y1, Y2, ..., Y20. The sensor electrodes X1, X2, ..., X10 may extend along a first dimension of the sensing region 170 (e.g., along the "Y" dimension), and may be arranged as a plurality of columns. The sensor electrodes Y1, Y2, ..., Y20 may extend along a second dimension of the sensing region 170 (e.g., along the "X" dimension), and may be arranged as a plurality of rows. As shown, the first dimension and the second dimension may be orthogonal, although other non-orthogonal arrangements are also contemplated. Thus, the sensing region 170 may be defined by 20 rows and 10 columns of sensor electrodes, although other numbers and arrangements of sensor electrodes are also contemplated. For example, multiple smaller sensor electrodes may be selectively ganged together to form larger sensor electrodes within the sensing region 170.

In some embodiments, the sensor module 310 may divide the sensing region 170 into a plurality of regions (e.g., using region information 420 of FIG. 4). As shown, the sensing region 170 may be divided into three regions along one dimension (as shown, the "Y" dimension): a region 705-1 including sensor electrodes Y1-Y10, a region 705-2 including sensor electrodes Y6-Y15, and a region 705-3 including sensor electrodes Y11-Y20. Although the regions 705-1, 705-2, 705-3 are shown as being approximately a same size (e.g., each including 10 rows), different sized regions are also contemplated. Although three regions 705-1, 705-2, 705-3 are shown, different numbers of regions (e.g., four or more) are also contemplated along one dimension. Further, other embodiments may have the sensing region 170 divided into multiple regions along multiple dimensions, as in FIG. 12 discussed below.

Each of the regions 705-1, 705-2, 705-3 may be partially overlapped by one or more other regions. For example, the region 705-1 may be partially overlapped by the region 705-2, the region 705-2 may be partially overlapped by the regions 705-1, 705-3, and the region 705-3 may be partially overlapped by the region 705-2. The overlap of the regions 705-1, 705-2 is reflected as overlap region 710-12, and the overlap of the regions 705-2, 705-3 is reflected as overlap region 710-23. Although each of the overlap regions 710-12, 710-23 is shown as being approximately 50% the size of the regions 705-1, 705-2, 705-3, different sized overlap regions are also contemplated. The overlap regions 710-12, 710-23 may be stored as overlap information 425 of FIG. 4.

A boundary 715-1 may be defined within the overlap region 710-12, and a boundary 715-2 may be defined within the overlap region 710-23. Each boundary 715-1, 715-2 may be defined within the respective overlap region 710-12, 710-23 halfway along the first ("Y") dimension. Each boundary 715-1, 715-2 may extend along the second ("X") dimension. However, other embodiments may have different arrangements of the boundaries 715-1, 715-2. The boundaries 715-1, 715-2 may be stored as boundary information 430 of FIG. 4.

In some embodiments, one of the boundaries 715-1, 715-2 may be used to determine which of the regions 705-1, 705-2, 705-3 will be scanned by the sensor module 310 when an active input device may be detected in one of the respective overlap regions 710-12, 710-23. For example, assume the sensor electrode Y12 within the overlap region 710-23 detects a presence of an active input device. The sensor module 310 may determine which of the regions 705-2, 705-3 to scan based on the position of the sensor electrode Y12 within the overlap region 710-23. For example, the sensor module 310 may select the region 705-2 to scan, as the sensor electrode Y12 is located to one side of the boundary 715-2. In contrast, the sensor module 310 may select the region 705-3 to scan if a sensor electrode Y15 within the overlap region 710-23 detects the presence of the active input device.

In some cases, one or more of the boundaries 715-1, 715-2 may be defined such that a particular sensor electrode is included on both sides of the respective boundaries 715-1, 715-2. For example, the sensor electrode Y8 may be included on both sides of the boundary 715-1, and the sensor electrode Y13 may be included on both sides of the boundary 715-2. In such cases, merely detecting the active input device by one of sensor electrodes Y8, Y13 may be inconclusive whether the active input device is located to one side of the boundary 715-1, 715-2 or the other. In some embodiments, assuming that the one of the sensor electrodes Y8, Y13 represents a closest sensor electrode to the active input device (e.g., having a greatest measured signal strength) a next-closest sensor electrode (e.g., having a next-greatest measured signal strength) may be determined to whether the active input device is located to one side of the boundary 715-1, 715-2 or the other. For example, assuming that the sensor electrode Y13 is determined to be the closest sensor electrode, one of the sensor electrodes Y12, Y14 adjacent to (or neighboring) the sensor electrode Y13 may be determined as a next-closest sensor electrode based on measured signal strength.

As discussed above, a location of the active input device may be determined by scanning the sensor electrodes of the sensing region 170. However, scanning the entirety of the sensing region 170 can be prohibitively costly in terms of hardware included in the receiver circuitry 410, and/or the amount of active input sensing time. According to embodiments described herein, the location of the active input device may be determined by scanning the sensor electrodes that are included in the selected region. In this way, the receiver circuitry 410 may need relatively less hardware (e.g., fewer AFEs) to complete active input sensing in a suitable amount of active input sensing time.

In some embodiments, a plurality of switches 725 may be connected with the sensor electrodes X1, X2, . . . , X10, Y1, Y2, . . . , Y20 and with the receiver circuitry 410. The switches 725 may be controlled using the region information (e.g., region information 420 of FIG. 4) to couple sensor signals 720 received from the selected ones of the sensor electrodes X1, X2, . . . , X10, Y1, Y2, . . . , Y20 onto a finite number of receive channels 730. The switches 725 may be implemented in any suitable form, such as transistors. By performing active input sensing according to the region information 420, an amount of time used for performing active input sensing may be reduced, permitting additional time budget within a given period to perform touch sensing and/or display updating. In other embodiments, assuming the amount of time budgeted for active input sensing remains constant, the active input sensing performance may be improved by performing a more focused active input sensing in the selected regions.

Figure 8:
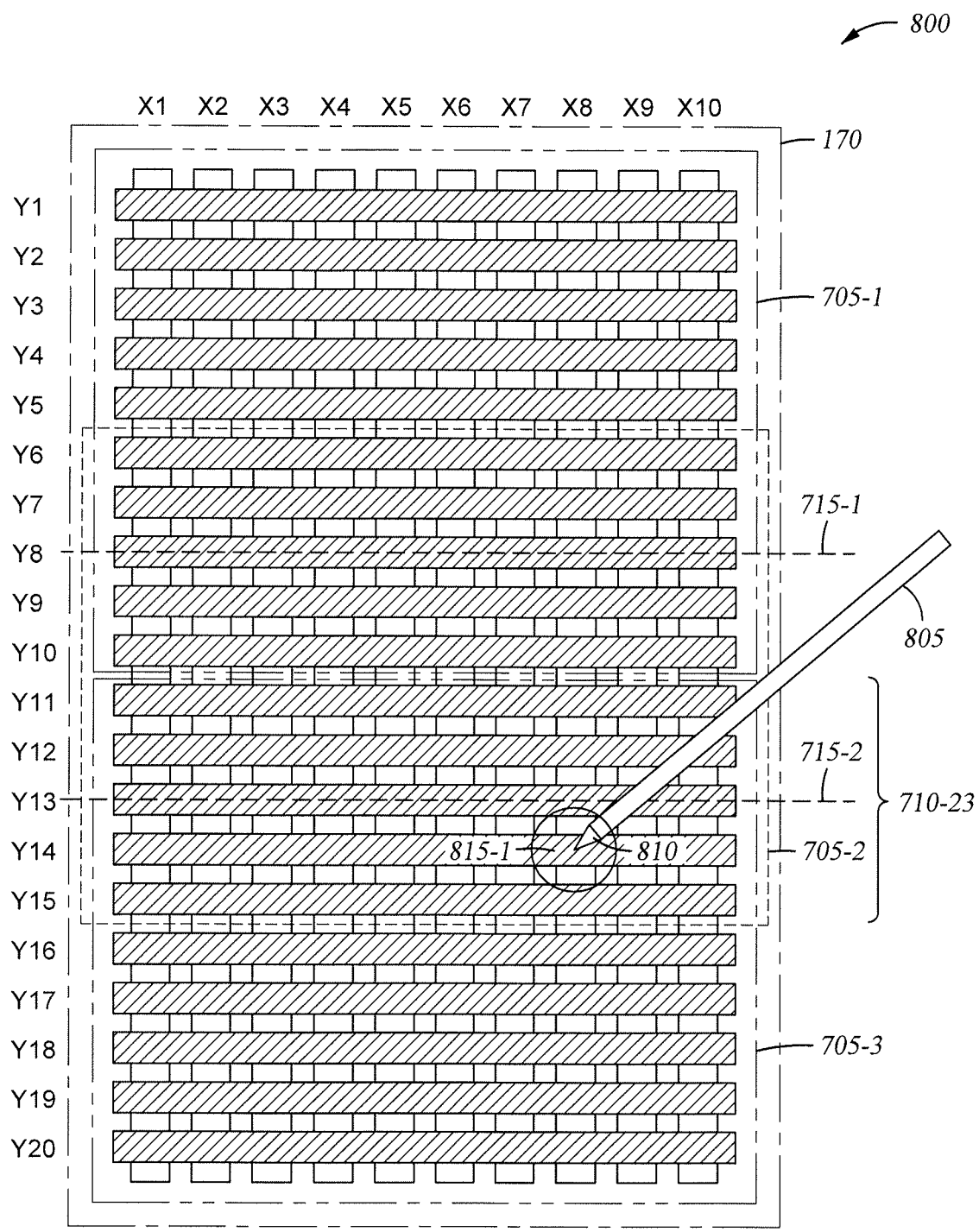
FIGS. 8 and 9 are diagrams illustrating other techniques for detecting a presence of an active input device, according to one or more embodiments.
Figure 9:
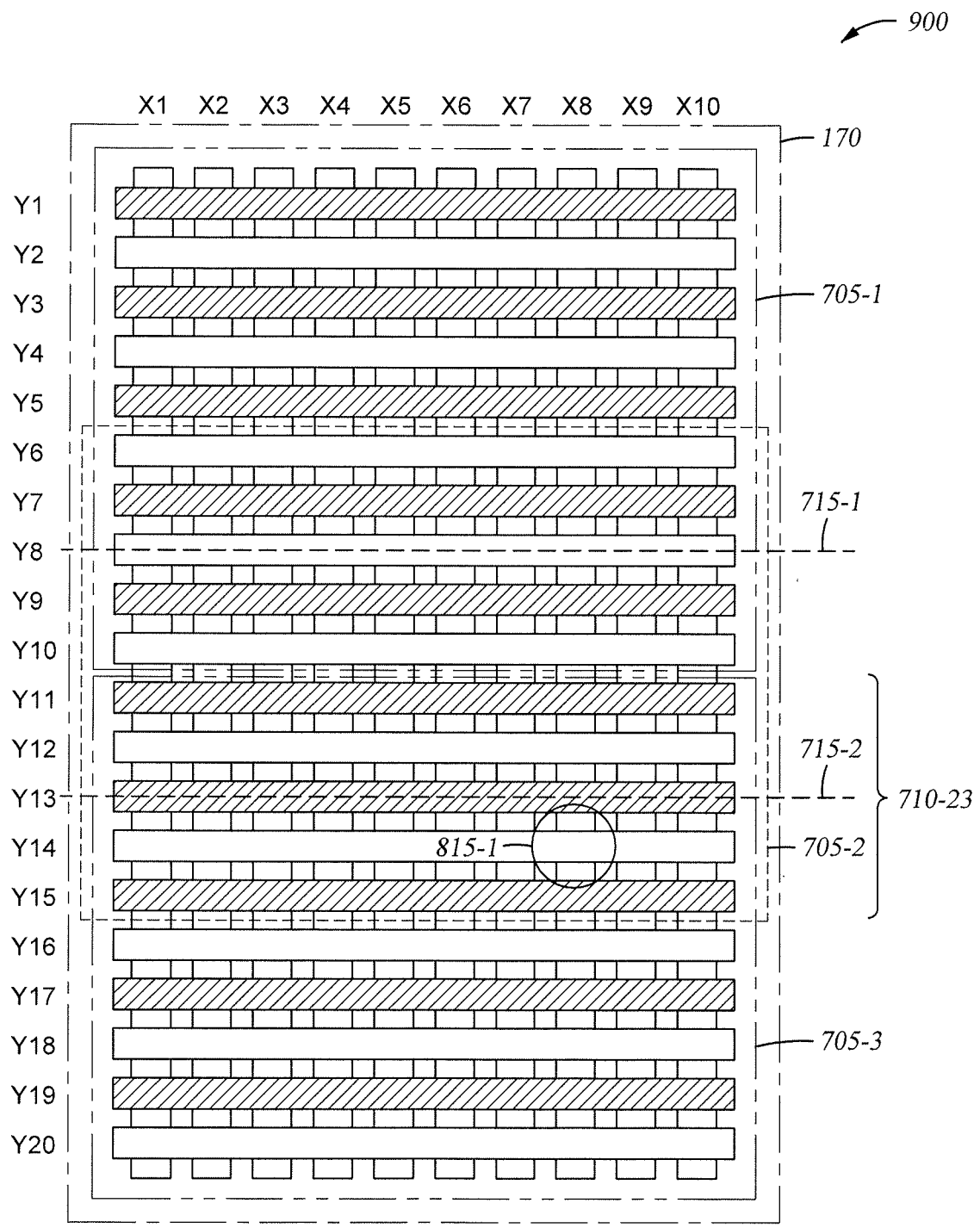

FIGS. 8 and 9 are diagrams 800, 900 illustrating other techniques for detecting a presence of an active input device, according to one or more embodiments. The features illustrated in the diagrams 800, 900 may be used in conjunction with other embodiments, e.g., performed by the sensor module 310.

In some embodiments, the sensor module 310 may sense with a reduced resolution while detecting a presence of an active input device (e.g., from a state in which the active input device is not detected). As shown in the diagram 800, the sensor electrodes Y1, Y2, . . . , Y20 may be connected with receiver circuitry (indicated by hatching), while the sensor electrodes X1, X2, . . . , X10 are not connected with the receiver circuitry. Thus, in the diagram 800, the input device may be configured to sense along only a first dimension of the sensing region 170 (e.g., along the "Y" dimension) using the first set of sensor electrodes Y1, Y2, . . . , Y20. In some embodiments, the number of sensor electrodes operated during the reduced resolution sensing may be less than or equal to the number of receive channels, such that measurements may be acquired for all of the sensor electrodes of a first set of sensor electrodes Y1, Y2, . . . , Y20 contemporaneously. For example, the number of sensor electrodes operated during the reduced resolution sensing may equal the number of receive channels to provide improved sensing performance.

In the diagram 800, a tip 810 of an active pen or a stylus 805, an example of the active input device, may be disposed at a first location above the sensor electrode Y14. A circle 815-1 represents the effects of the active pen 805 transmitting one or more signals through the tip 810. Thus, the sensor electrodes Y13, Y14, Y15 may each receive electrical charge from the transmitted one or more signals. As the tip 810 may be closest to the sensor electrode Y14, the sensor electrode Y14 may have a greatest measured signal strength compared with that of the sensor electrodes Y13, Y15, such that the active pen 805 is determined as being detected by the sensor electrode Y14. As the sensor electrode Y14 may be located to the region 705-3 side of the boundary 715-2, the sensor module 310 may determine to scan region 705-3.

As shown in the diagram 900, the sensor electrodes Y1, Y3, Y5, Y7, Y9, Y11, Y13, Y15, Y17, Y19 may be connected with the receiver circuitry (indicated by hatching). The sensor electrodes Y2, Y4, Y6, Y8, Y10, Y12, Y14, Y16, Y18, Y20, as well as the sensor electrodes X1, X2, . . . , X10, may be not connected with the receiver circuitry. Thus, in the diagram 900, the input device may be configured to sense with a reduced resolution, along only a first dimension of the sensing region 170 (e.g., along the "Y" dimension)

using alternating electrodes along the first dimension (e.g., the first set of sensor electrodes Y1, Y3, Y5, Y7, Y9, Y11, Y13, Y15, Y17, Y19 in the embodiment of FIG. 9). Other arrangements of the first set of sensor electrodes are also contemplated, such as other repeating (e.g., sensing using every third electrode) or non-repeating patterns.

As with the diagram 800, the active pen may be disposed at a first location above the sensor electrode Y14. The effects of the active pen, represented by the circle 815-1, may be detected by the sensor electrodes Y13, Y15. When the measured signal strength at the sensor electrodes Y13, Y15 is nearly equal and/or less than a threshold strength, this may indicate that the active pen is located between the sensor electrodes Y13, Y15 (e.g., inferring that the active pen is closer to the sensor electrode Y14 than to either of the sensor electrodes Y13, Y15). As the sensor electrode Y14 is arranged completely to one side of the boundary 715-2, the sensor module 310 may select the region 705-3.

Assume another case in which the sensor electrode Y14 is included on both sides of the boundary 715-2. When the effects of the active pen are detected by the sensor electrodes Y13, Y15, such that the sensor electrode Y14 is inferred to be the closest sensor electrode, it may be inconclusive whether the active input device is located to one side of the boundary 715-2 or the other. In such a case, a greater measured signal strength for the sensor electrode Y13 or for the sensor electrode Y15 may indicate that the active input device is located to one side of the boundary 715-2 or the other. If the measured signal strengths are the same for the sensor electrodes Y13, Y15, other tie-breaking procedure(s) may be used to determine that the active input device is located to one side of the boundary 715-2 or the other. In one example, the sensor module 310 may determine next-closest sensor electrodes for the sensor electrodes Y13, Y15, e.g., comparing measured signal strengths of the sensor electrodes Y11, Y17.

Although the diagrams 800, 900 illustrate detecting a presence of an active input device with reduced resolution sensing along only one dimension of the sensing region 170 (e.g., along the "Y" dimension), other implementations are also contemplated. For example, the reduced resolution sensing may be performed along another dimension of the sensing region 170 (e.g., along the "X" dimension), and/or performed along multiple dimensions of the sensing region 170 (e.g., along both the "X" and "Y" dimensions). Further, the set of sensor electrodes used for the reduced resolution sensing may have any suitable arrangement.

Figure 10:
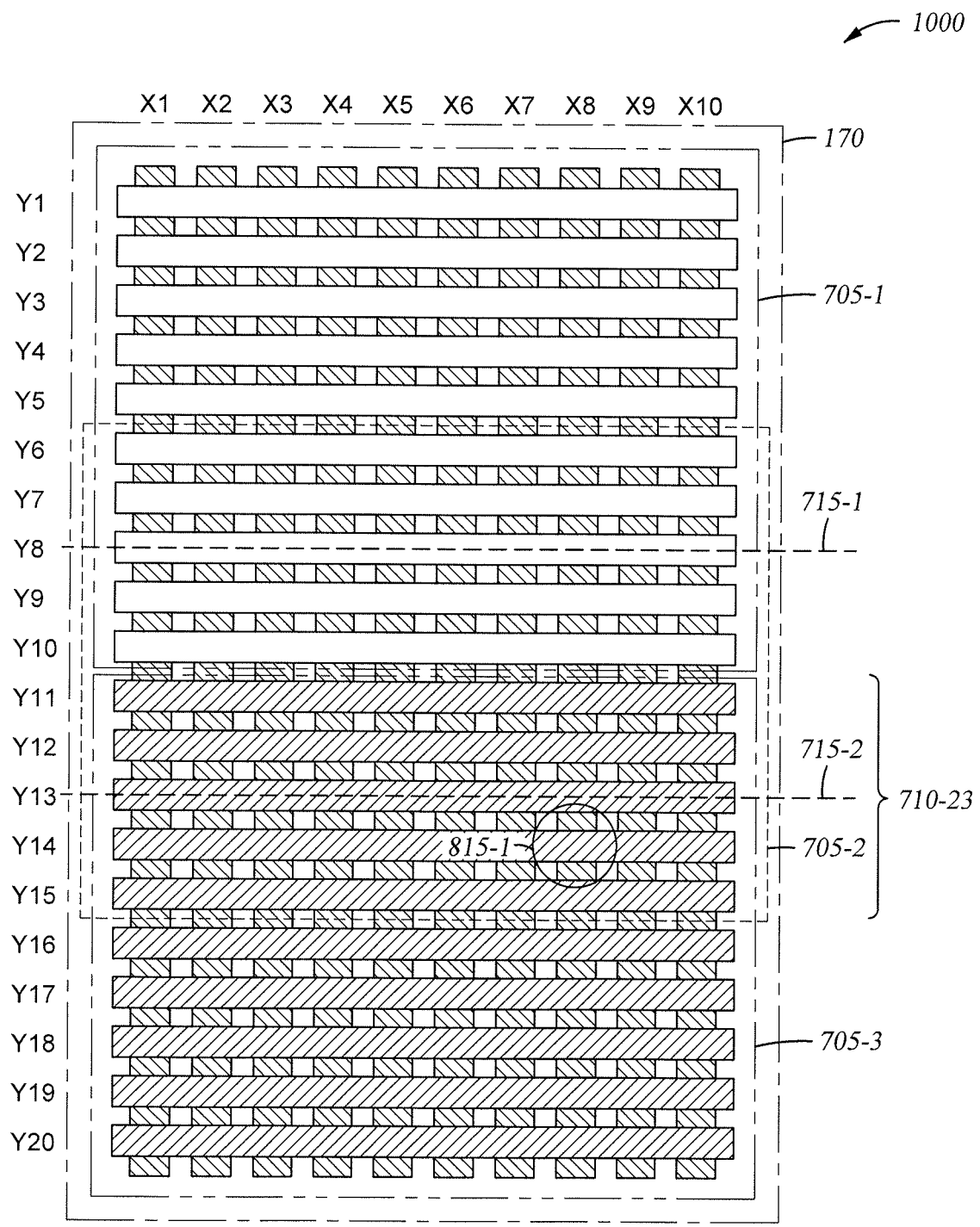
FIGS. 10 and 11 are diagrams illustrating determining a location of an input device, according to one or more embodiments.
Figure 11:
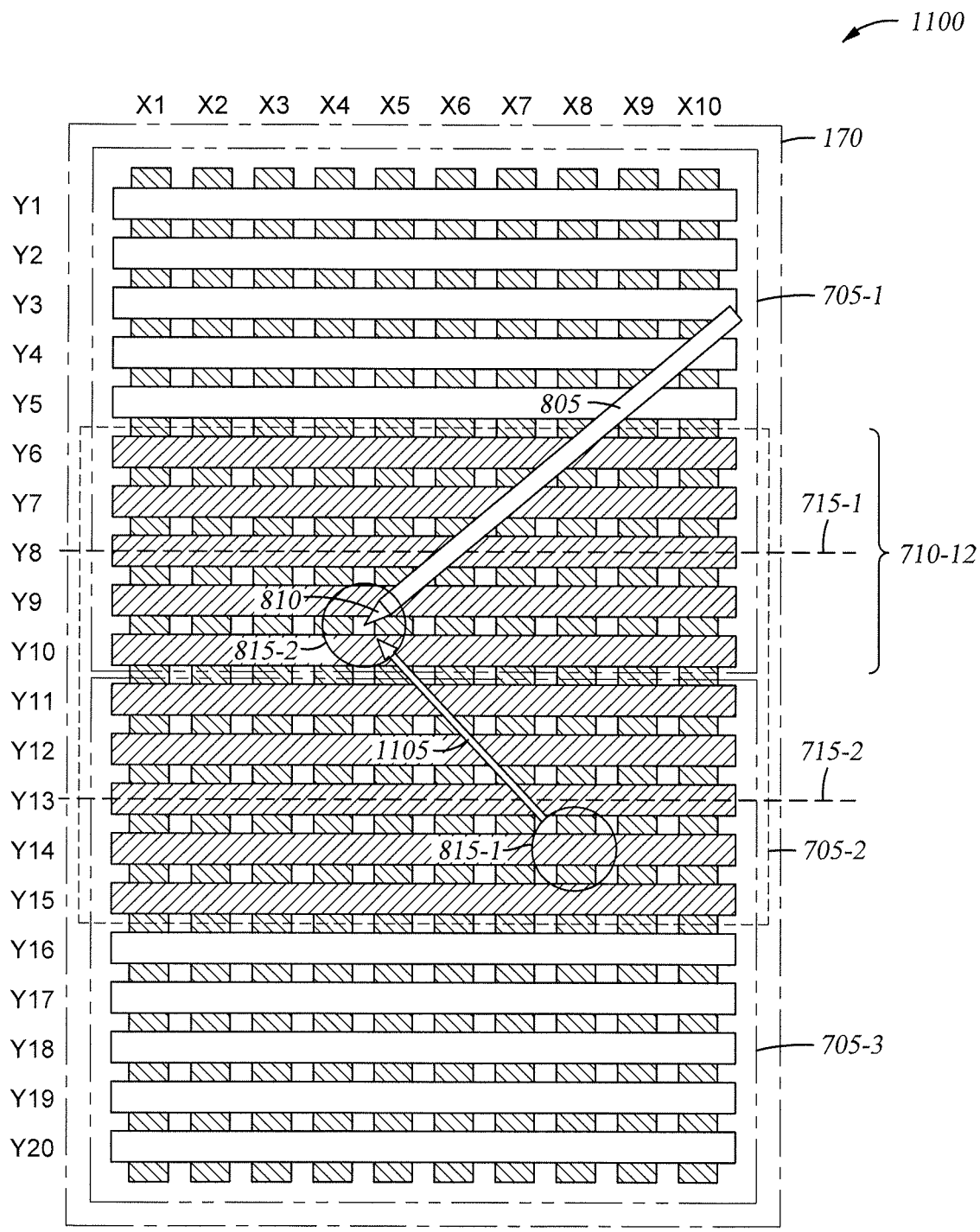

FIGS. 10 and 11 are diagrams 1000, 1100 illustrating determining a location of an input device, according to one or more embodiments. The features illustrated in the diagrams 1000, 1100 may be used in conjunction with other embodiments, for example, being performed after detecting the presence of an active input device as illustrated in FIG. 8 or FIG. 9.

In the diagram 1000, the circle 815-1 indicates that the active pen may be disposed at a first location above the sensor electrodes Y14, X8. The circle 815-1 indicates that the sensor electrodes Y13, Y14, Y15, X8 each receive electrical charge from the transmitted one or more signals from the active pen. Based on measured signal strengths, the sensor electrode Y14 may be determined to be the closest sensor electrode, and one of sensor electrodes Y13, Y15 may be determined as a next-closest sensor electrode.

As the sensor electrode Y14 is located to the region 705-3 side of the boundary 715-2, the sensor module 310 may select the region 705-3 to scan. As shown, active sensing may be performed using all of the sensor electrodes in the region 705-3. The sensor electrodes Y11-Y20, X1-X10 are connected with the receiver circuitry (indicated by hatching), while the sensor electrodes Y1-Y10 are not connected with the receiver circuitry. By scanning the selected region 705-3, the location of the active pen may be determined using fewer sensor electrode measurements, reducing an amount of time used for performing active input sensing and/or improving active input sensing performance.

In the diagram 1100, the tip 810 of the active pen 805 may be moved to a second location between the sensor electrodes Y9, Y10 and between the sensor electrodes X4, X5. The movement of the tip 810 between the first location and the second location is indicated by the arrow 1105. A circle 815-2 represents the effects of the active pen 805 transmitting one or more signals through the tip 810. Thus, the sensor electrodes Y9, Y10, X4, X5 may each receive electrical charge from the transmitted one or more signals. As the movement of the tip 810 causes the active pen 805 to cross the boundary 715-2, the sensor module may select region 705-2 to scan. As shown, active sensing may be performed using all of the sensor electrodes in the region 705-2. The sensor electrodes Y6-Y15, X1-X10 may be connected with the receiver circuitry (indicated by hatching), while the sensor electrodes Y1-Y5, Y16-Y20 are not connected with the receiver circuitry.

Figure 12:
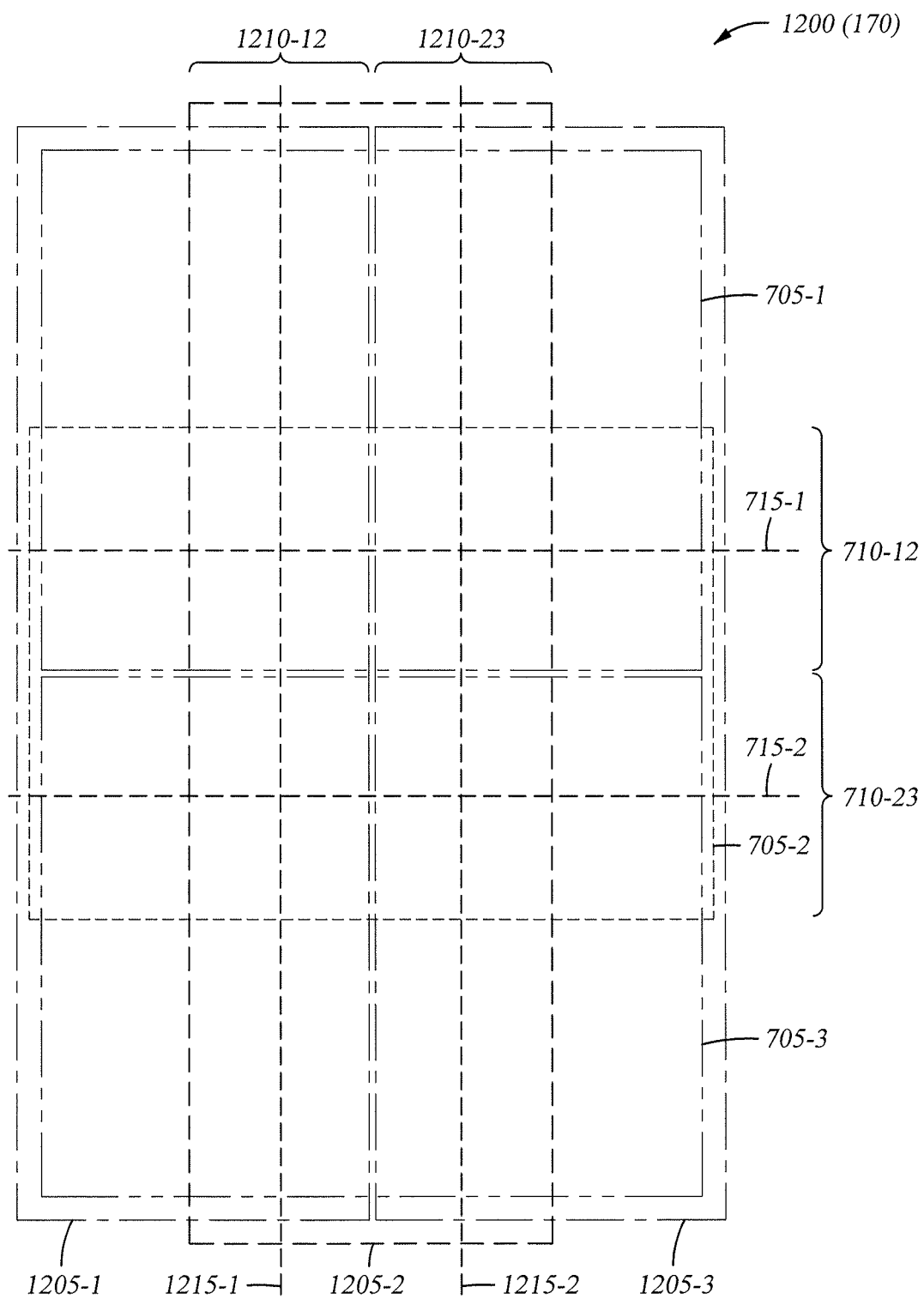
FIG. 12 is a diagram illustrating a sensing region divided into partially overlapping regions along two dimensions, according to one or more embodiments.

FIG. 12 is a diagram 1200 illustrating a sensing region 170 divided into partially overlapping regions along two dimensions, according to one or more embodiments. The features illustrated in the diagram 1200 may be used in conjunction with other embodiments, e.g., reflecting performance of a portion of the method 600 by the sensor module 310.

In the diagram 1200, the sensor electrodes defining the sensing region 170 are not depicted for clarity of the different regions. As shown, the sensing region 170 may be divided into three regions 705-1, 705-2, 705-3 along the "Y" dimension, and may be further divided into three regions 1205-1, 1205-2, 1205-3 along the "X" dimension. Although the regions 1205-1, 1205-2, 1205-3 are shown as being approximately a same size, different sized regions are also contemplated.

Each of the regions 1205-1, 1205-2, 1205-3 may be partially overlapped by one or more other regions. For example, the region 1205-1 may be partially overlapped by the region 1205-2, the region 1205-2 may be partially overlapped by the regions 1205-1, 1205-3, and the region 1205-3 may be partially overlapped by the region 1205-2. The overlap of the regions 1205-1, 1205-2 is reflected as overlap region 1210-12, and the overlap of the regions 1205-2, 1205-3 is reflected as overlap region 1210-23. Although each of the overlap regions 1210-12, 1210-23 is shown as being approximately 50% the size of the regions 1205-1, 1205-2, 1205-3, different sized overlap regions are also contemplated. The overlap regions 1210-12, 1210-23 may be stored as overlap information 425 of FIG. 4.

A boundary 1215-1 may be defined within the overlap region 1210-12, and a boundary 1215-2 may be defined within the overlap region 1210-23. Each boundary 1215-1, 1215-2 may be defined within the respective overlap region 1210-12, 1210-23 halfway along the "X" dimension. Each boundary 1215-1, 1215-2 may extend along the "Y" dimension. However, other embodiments may have different arrangements of the boundaries 1215-1, 1215-2. The boundaries 1215-1, 1215-2 may be stored as boundary information 430 of FIG. 4.

Although each of the regions 705-1, 705-2, 705-3 are shown as extending the entire width (along the "X" dimension) of the sensing region 170, and each the regions 1205-1, 1205-2, 1205-3 are shown as extending the entire length (along the "Y" dimension) of the sensing region 170, other implementations may include overlapping regions that do not extend fully along a dimension of the sensing region 170.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. A method of sensing during one or more sensing periods, each sensing period comprising a touch sensing sub-period and at least one active input sensing sub-period, the method comprising:
   dividing a sensing region into a plurality of regions, wherein the sensing region is defined by a plurality of sensor electrodes, and wherein each region of the plurality of regions is partially overlapped by one or more other regions of the plurality of regions;
   detecting, during at least a first active input sensing sub-period of a first sensing period, a presence of an active input device by a first sensor electrode of the plurality of sensor electrodes, wherein the first sensor electrode is within a first overlap region in which a first region of the plurality of regions overlaps a second region of the plurality of regions;
   selecting, based on a location of the first sensor electrode within the first overlap region, one region of the first region and the second region to scan, wherein selecting the one region comprises:
      defining a boundary within the first overlap region; and
      determining on which side of the boundary the first sensor electrode is located; and
   scanning, during at least a second active input sensing sub-period, sensor electrodes that are included in the selected region to determine a location of the active input device.

2. The method of claim 1, wherein the boundary is defined halfway along one dimension of the first overlap region.

3. The method of claim 1,
   wherein the boundary is defined such that the first sensor electrode is located on both sides of the boundary, and
   wherein selecting the one region of the first region and the second region further comprises:
      determining a next-closest sensor electrode to the first sensor electrode.

4. The method of claim 1, wherein determining the location of the active input device comprises:
   during the second active input sensing sub-period, determining the location of the active input device along a first dimension and along a second dimension of the sensing region.

5. The method of claim 4, wherein determining the location of the active input device during the second active input sensing sub-period comprises sensing a first frequency transmitted by the active input device, and wherein the method further comprises: during a third active input sensing sub-period, sensing a second frequency transmitted by the active input device.

6. The method of claim 1,
   wherein each sensing period comprises a respective plurality of distributed touch sensing sub-periods, and
   wherein, using the respective plurality of distributed touch sensing sub-periods, a respective touch frame is acquired in each sensing period corresponding to an entirety of the sensing region.

7. The method of claim 6, wherein each sensing period comprises a respective plurality of active input sensing sub-periods.

8. The method of claim 1, wherein detecting the presence of an active input device comprises sensing with a reduced resolution using a first set of sensor electrodes of the plurality of sensor electrodes.

9. The method of claim 8,
   wherein detecting the presence of an active input device comprises sensing along only a first dimension of the sensing region using the first set of sensor electrodes, and
   wherein determining the location of the active input device comprises sensing along the first dimension and a second dimension of the sensing region using a second set of sensor electrodes of the plurality of sensor electrodes.

10. The method of claim 9, wherein the first set of sensor electrodes comprises alternating electrodes along the first dimension.

11. An input device, comprising:
   a plurality of sensor electrodes defining a sensing region; and
   a processing system configured to:
   divide the sensing region into a plurality of regions, wherein each region of the plurality of regions is partially overlapped by one or more other regions of the plurality of regions;
   detect, during at least a first active input sensing sub-period of a first sensing period comprising a touch sensing sub-period and at least one active input sensing sub-period, a presence of an active input device by a first sensor electrode of the plurality of sensor electrodes, wherein the first sensor electrode is within a first overlap region in which a first region of the plurality of regions overlaps a second region of the plurality of regions;
   select, based on a location of the first sensor electrode within the first overlap region, one region of the first region and the second region to scan, wherein selecting the one region comprises:
      defining a boundary within the first overlap region; and
      determining on which side of the boundary the first sensor electrode is located; and
   scan, during at least a second active input sensing sub-period, sensor electrodes that are included in the selected region to determine a location of the active input device.

12. The input device of claim 11, wherein determining the location of the active input device comprises:
   during the second active input sensing sub-period, determining the location of the active input device along a first dimension and along a second dimension of the sensing region.

13. The input device of claim 11, wherein the first sensing period comprises a plurality of distributed touch sensing sub-periods, and wherein the processing system is configured to acquire, using the plurality of distributed touch sensing sub-periods, a touch frame in the first sensing period corresponding to an entirety of the sensing region.

14. A processing system for operating a plurality of sensor electrodes defining a sensing region, the processing system comprising:

sensor circuitry configured to:

divide the sensing region into a plurality of regions, wherein each region of the plurality of regions is partially overlapped by one or more other regions of the plurality of regions;

detect, during at least a first active input sensing sub-period of a first sensing period comprising a touch sensing sub-period and at least one active input sensing sub-period, a presence of an active input device by a first sensor electrode of the plurality of sensor electrodes, wherein the first sensor electrode is within a first overlap region in which a first region of the plurality of regions overlaps a second region of the plurality of regions;

select, based on a location of the first sensor electrode within the first overlap region, one region of the first region and the second region to scan, wherein selecting the one region comprises:

defining a boundary within the first overlap region; and determining on which side of the boundary the first sensor electrode is located; and scan, during at least a second active input sensing sub-period, sensor electrodes that are included in the selected region to determine a location of the active input device.

15. The processing system of claim 14, wherein determining the location of the active input device comprises:

during the second active input sensing sub-period, determining the location of the active input device along a first dimension and along a second dimension of the sensing region.

16. The processing system of claim 14, wherein the first sensing period comprises a plurality of distributed touch sensing sub-periods, and wherein the sensor circuitry is configured to acquire, using the plurality of distributed touch sensing sub-periods, a touch frame in the first sensing period corresponding to an entirety of the sensing region.

* * * * *